(12) United States Patent  
Morgan et al.

(10) Patent No.: US 9,263,605 B1
(45) Date of Patent: *Feb. 16, 2016

(54) PULSED STIMULATED EMISSION LUMINESCENT PHOTOVOLTAIC SOLAR CONCENTRATOR

(75) Inventors: John Paul Morgan, Toronto (CA); Pascal Dufour, Toronto (CA)

(73) Assignee: MORGAN SOLAR INC., Toronto (CA)

(*) Notice: Subject to any disclaimer, the term of this patent is extended or adjusted under 35 U.S.C. 154(b) by 347 days.

This patent is subject to a terminal disclaimer.

(21) Appl. No.: 13/452,588

(22) Filed: Apr. 20, 2012

Related U.S. Application Data

(60) Provisional application No. 61/477,265, filed on Apr. 20, 2011.

(51) Int. Cl.
*H01L 31/055* (2014.01)
*H02S 40/22* (2014.01)
*H01L 31/0232* (2014.01)
*F21V 8/00* (2006.01)

(52) U.S. Cl.
CPC ........ *H01L 31/02322* (2013.01); *G02B 6/0003* (2013.01); *H01L 31/055* (2013.01)

(58) Field of Classification Search
CPC ............ H01L 31/055; H01L 31/02322; H01L 31/054; F24J 2/065; F24J 2/067; G02B 19/0042
USPC .................................................. 136/243–256
See application file for complete search history.

(56) References Cited

U.S. PATENT DOCUMENTS 3,426,212 A 2/1969 Klaas
3,484,607 A 12/1969 McGuire et al.
3,732,505 A 5/1973 Freedman (Continued)

FOREIGN PATENT DOCUMENTS

CN 101951189 A 1/2001
CN 102142892 A 8/2001

(Continued)

OTHER PUBLICATIONS

Mapel, J.: "Organic Photovoltaics and Concentrators", Jun. 2008, 169p.

(Continued)

*Primary Examiner* — Jonathan Johnson
*Assistant Examiner* — Andrew Golden
(74) *Attorney, Agent, or Firm* — BCF LLP

(57) ABSTRACT

A solar concentrator comprising: a light-transmissive sheet including: a plurality of luminescent particles capable of becoming excited by absorbing light within at least a first spectrum of absorption frequencies and, once excited, capable of being stimulated to emit light having a spectrum within at least a first spectrum of emission frequencies; and a first light-guide; and a light source for generating a pulsed probe light having a spectrum, at least a portion of which is within at least the first spectrum of emission frequencies, for stimulating at least one of the excited luminescent particles having absorbed light within the first spectrum of absorption frequencies such that when the probe light traveling in a first direction of travel stimulates the excited luminescent, the excited luminescent particles emit emitted light having a spectrum within the first spectrum of emission frequencies in the first direction of travel of the probe light.

19 Claims, 30 Drawing Sheets

(56) References Cited

U.S. PATENT DOCUMENTS

| | | | |
|---|---|---|---|
| 3,929,510 A | 12/1975 | Kittl | |
| 4,001,704 A | 1/1977 | Danielmeyer et al. | |
| 4,140,979 A | 2/1979 | Ramer | |
| 4,146,790 A | 3/1979 | Goetzberger et al. | |
| 4,149,902 A | 4/1979 | Mauer et al. | |
| 4,186,033 A | 1/1980 | Boling et al. | |
| 4,193,819 A * | 3/1980 | Wohlmut | 136/247 |
| 4,262,206 A | 4/1981 | Viehmann | |
| 4,268,709 A | 5/1981 | Boling | |
| 4,281,294 A | 7/1981 | Volkin | |
| 4,292,959 A | 10/1981 | Coburn | |
| 4,357,704 A | 11/1982 | Koechner | |
| 4,425,907 A | 1/1984 | Younghouse | |
| 4,488,047 A | 12/1984 | Thomas | |
| 4,799,748 A | 1/1989 | Brown | |
| 5,095,487 A | 3/1992 | Meyerhofer et al. | |
| 5,422,907 A | 6/1995 | Bhargava | |
| 5,431,742 A | 7/1995 | Kleinerman | |
| 5,575,860 A * | 11/1996 | Cherney | 136/245 |
| 5,978,407 A | 11/1999 | Chang et al. | |
| 6,476,312 B1 | 11/2002 | Barnham | |
| 6,744,960 B2 | 6/2004 | Pelka | |
| 7,417,789 B2 | 8/2008 | Chi et al. | |
| 8,152,339 B2 | 4/2012 | Morgan | |
| 2006/0016448 A1 * | 1/2006 | Ho | 126/698 |
| 2007/0295383 A1 | 12/2007 | Li et al. | |
| 2008/0149165 A1 | 6/2008 | Hoeks et al. | |
| 2008/0223438 A1 | 9/2008 | Xiang et al. | |
| 2008/0271776 A1 * | 11/2008 | Morgan | 136/246 |
| 2009/0032083 A1 | 2/2009 | Torrance et al. | |
| 2009/0044861 A1 | 2/2009 | Debije et al. | |
| 2009/0095341 A1 | 4/2009 | Pfenninger et al. | |
| 2009/0157329 A1 | 6/2009 | Weightman et al. | |
| 2009/0199893 A1 | 8/2009 | Bita et al. | |
| 2009/0277494 A1 | 11/2009 | Mazzer et al. | |
| 2010/0126577 A1 | 5/2010 | Wu et al. | |
| 2010/0139749 A1 | 6/2010 | Mapel | |
| 2010/0139769 A1 | 6/2010 | Mapel | |
| 2010/0180932 A1 | 7/2010 | Wang et al. | |
| 2010/0193011 A1 | 8/2010 | Mapel et al. | |
| 2010/0307584 A1 | 12/2010 | Goldschmidt et al. | |
| 2010/0316331 A1 | 12/2010 | Kenney et al. | |
| 2011/0168236 A1 | 7/2011 | Chan et al. | |
| 2011/0253197 A1 | 10/2011 | Mapel et al. | |
| 2012/0031466 A1 | 2/2012 | Bruer | |
| 2012/0038841 A1 | 2/2012 | Taheri et al. | |

FOREIGN PATENT DOCUMENTS

| | | |
|---|---|---|
| CN | 102237430 A | 11/2001 |
| DE | 2737847 A1 | 3/1979 |
| DE | 3007543 A1 | 9/1981 |
| DE | 102009019940 A1 | 11/2010 |
| EP | 2056361 A1 | 5/2009 |
| JP | 2003526190 A | 9/2003 |
| WO | 01066997 A2 | 9/2001 |
| WO | 03/009012 A2 | 1/2003 |
| WO | 2006/088369 A2 | 8/2006 |
| WO | 2006/088370 A2 | 8/2006 |
| WO | 2007/045917 A2 | 4/2007 |
| WO | 2008/157621 A2 | 12/2008 |
| WO | 2009002943 A2 | 12/2008 |
| WO | 2009/067479 A2 | 5/2009 |
| WO | 2009/141295 A1 | 11/2009 |
| WO | 2010/045634 A2 | 4/2010 |
| WO | 2010/048484 A2 | 4/2010 |
| WO | 2010/067296 A1 | 6/2010 |
| WO | 2010/076791 A2 | 7/2010 |
| WO | 2011/012545 A1 | 2/2011 |

OTHER PUBLICATIONS

Luque, A. et al.:"Fullspectrum: a new PV wave making more efficient use of the solar spectrum", Solar Energy Materials & Solar Cells, 87, 2005, pp. 467-479.

Mayr, T. et al.: "A planar waveguide optical sensor employing simple light coupling", Analyst, The Royal Society of Chemistry, 2009, 134, pp. 1544-1547.

Barnham, K. et al.: "Nanoscale energy conversion in the quantum well solar cell", [http://www.authorstream.com/Presentation/Urban-45575-Barnham-Nanoscale-Energy-Conversion-Quantum-Solar-Cell-Outline-efficiency-versus-or-Eg-Ga-as-Education-ppt-powerpoint/].

Jones-Bey, H.: "Optical modeling determines luminescent solar-concentrator efficiency", Laser Focus World, Feb. 2009, pp. 20-22.

Sark W. et al.: "Luminescent Solar Concentrators—A review of recent results", Optics Express, vol. 16, No. 26, Dec. 22, 2008, 20p.

PCT International Patent Application No. PCT/CA2010/000363, International Search Report dated Jun. 16, 2010.

Rubenchik A.M. et al.: "Solar Pumped Laser Microthruster", Feb. 17, 2010; Lawrence Livermore National Laboratory; HPLA 2010, Santa Fe, NM, United States, Apr. 18, 2010 through Apr. 22, 2010.

Landis, Geoffrey A.: "Prospects for Solar Pumped Semiconductor Lasers": Paper SPIE 2121-09, Laser Power Beaming, SPIE Proceedings vol. 2121, pp. 58-65 (1994); pp. 1-11.

English abstract of JP2003526190; retrieved from Espacenet on Apr. 28, 2015.

Supplementary Search Report from EP 10750294; May 7, 2013; Oscar Chao.

* cited by examiner

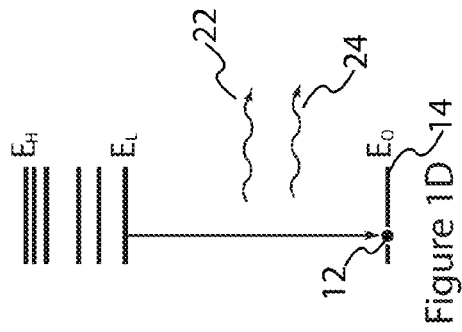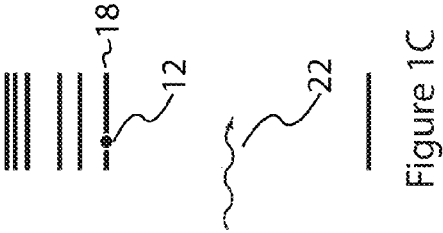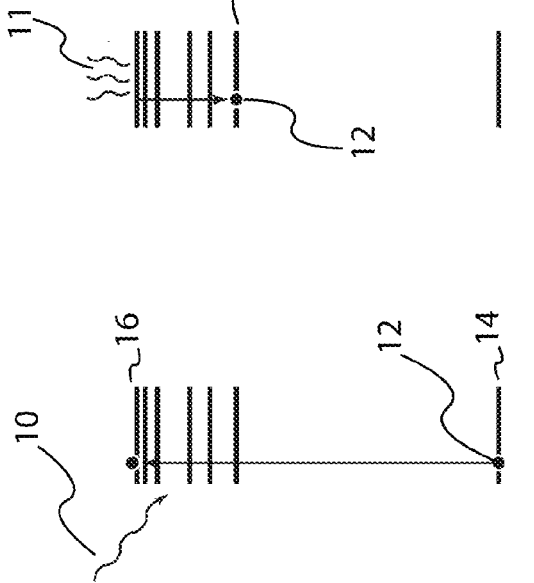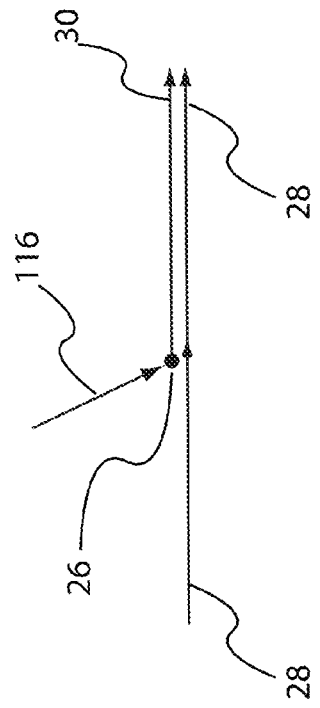

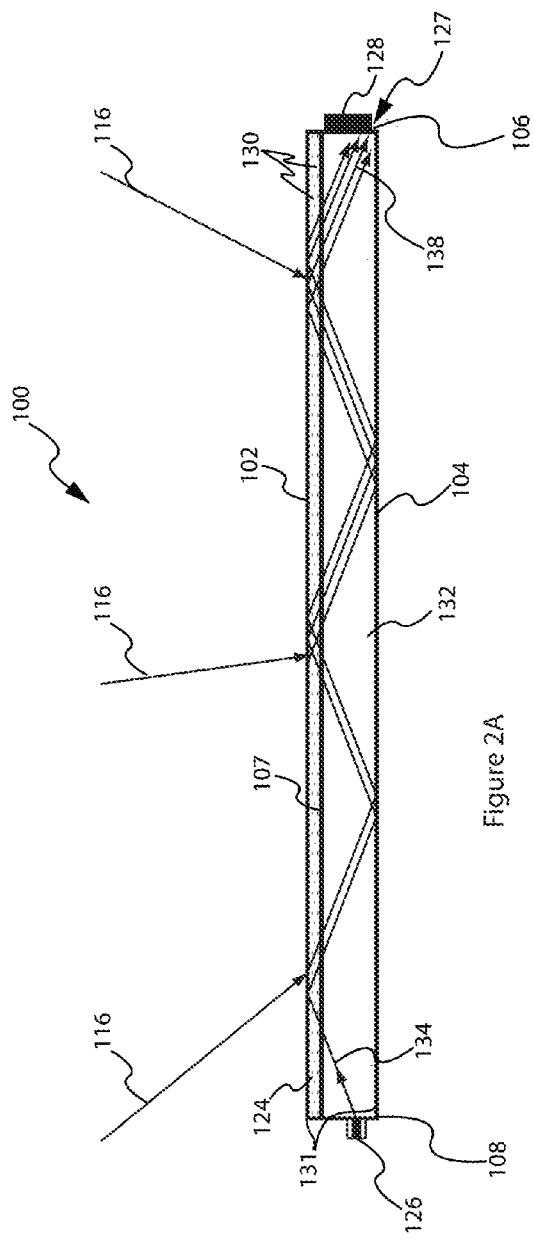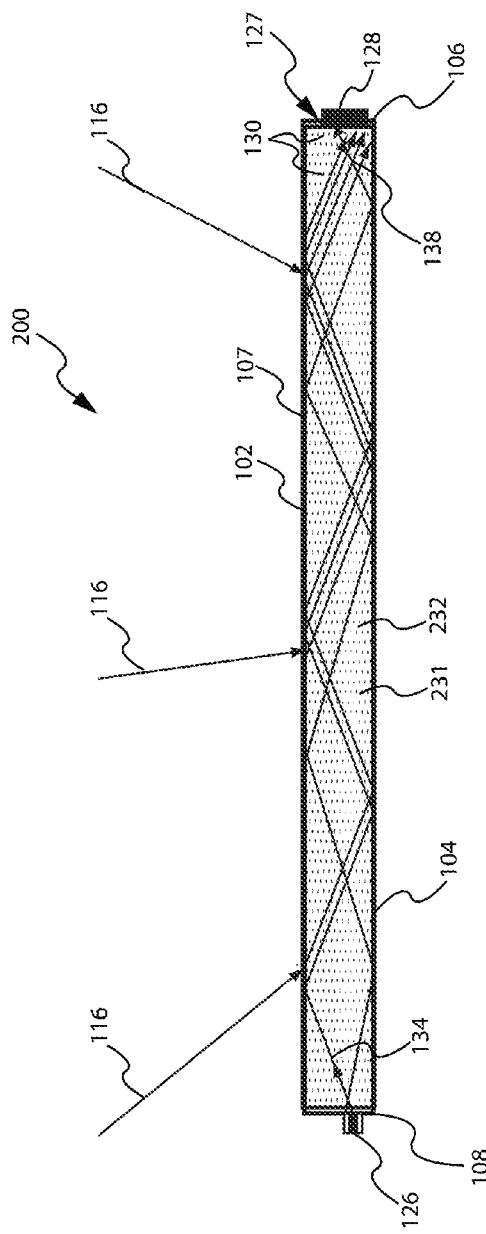

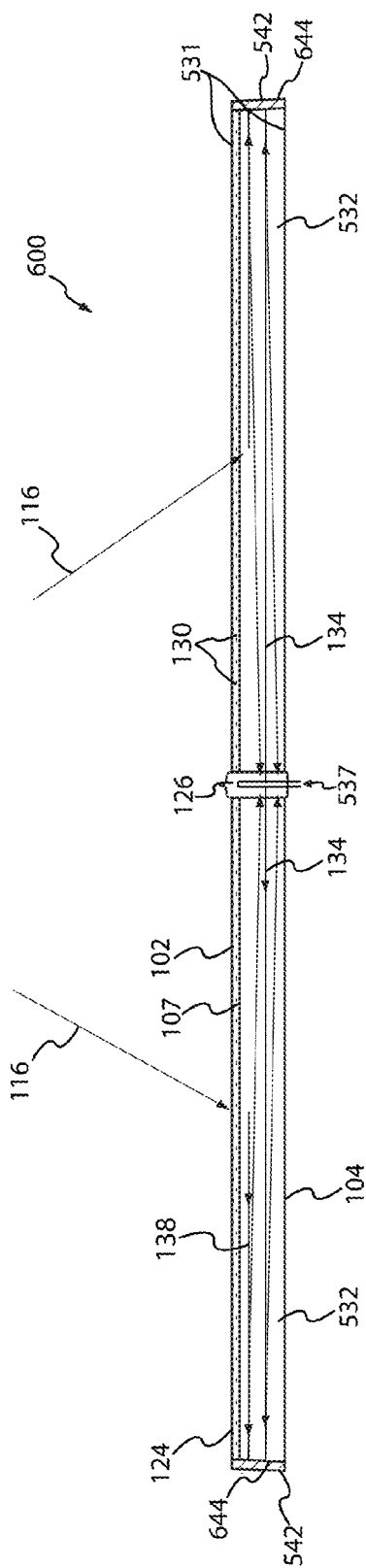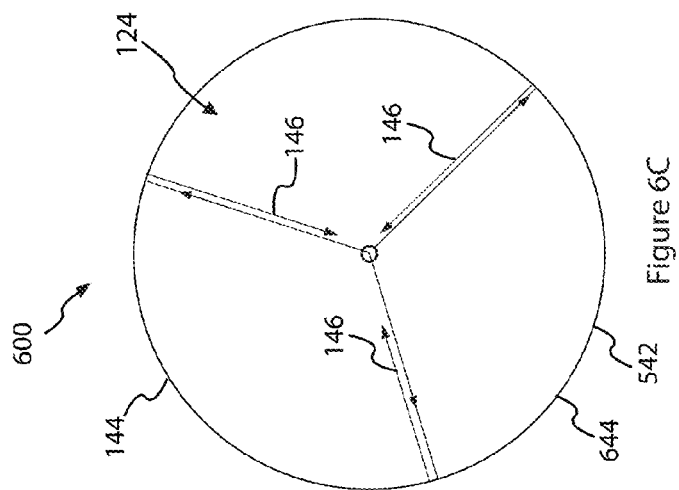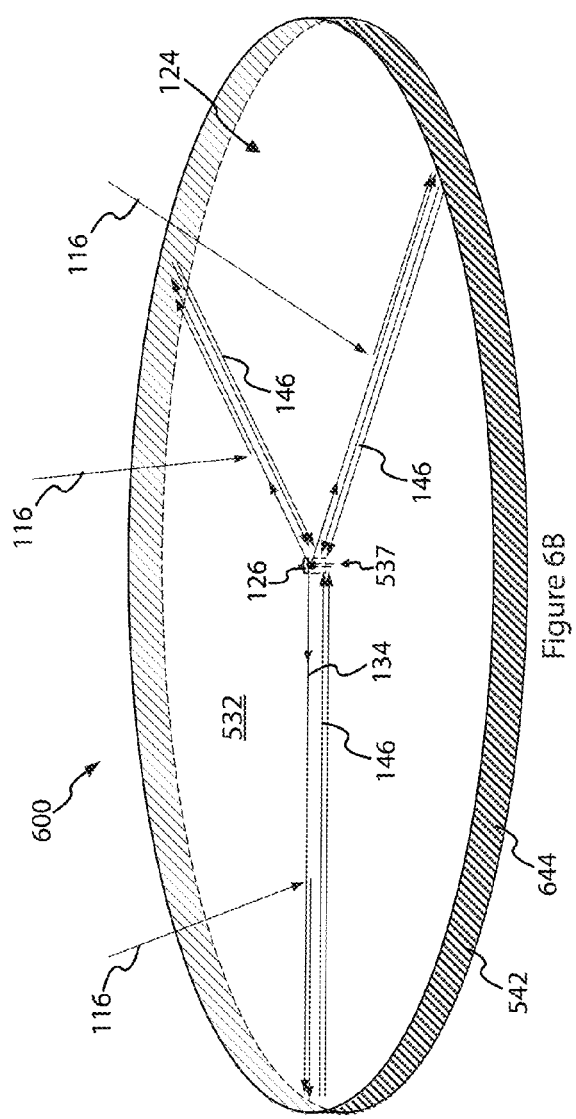
Figure 6A
Figure 6B
Figure 6C

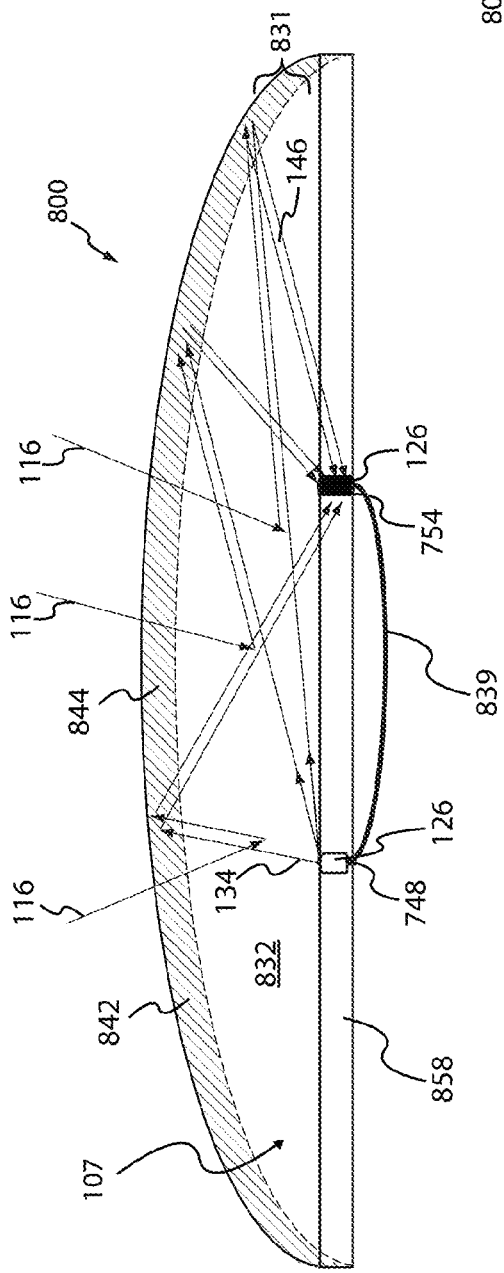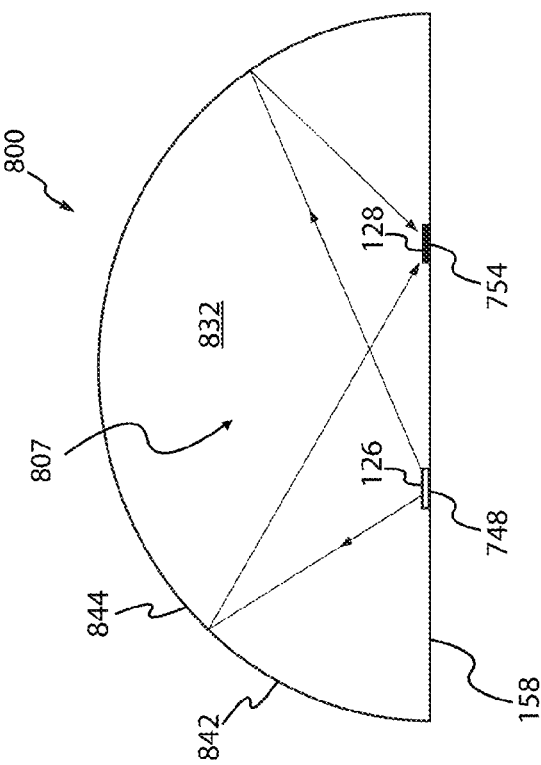
Figure 8A
Figure 8B

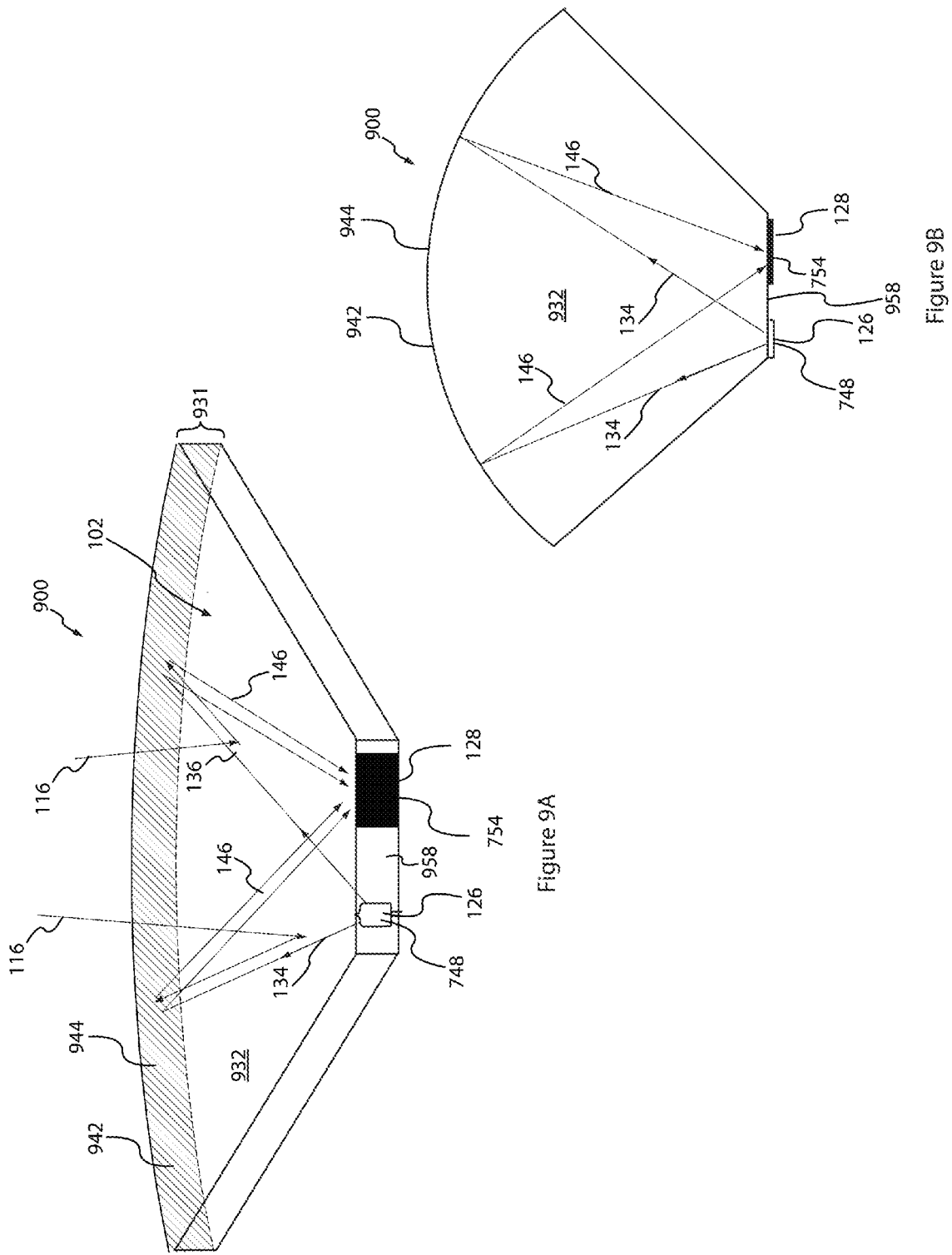

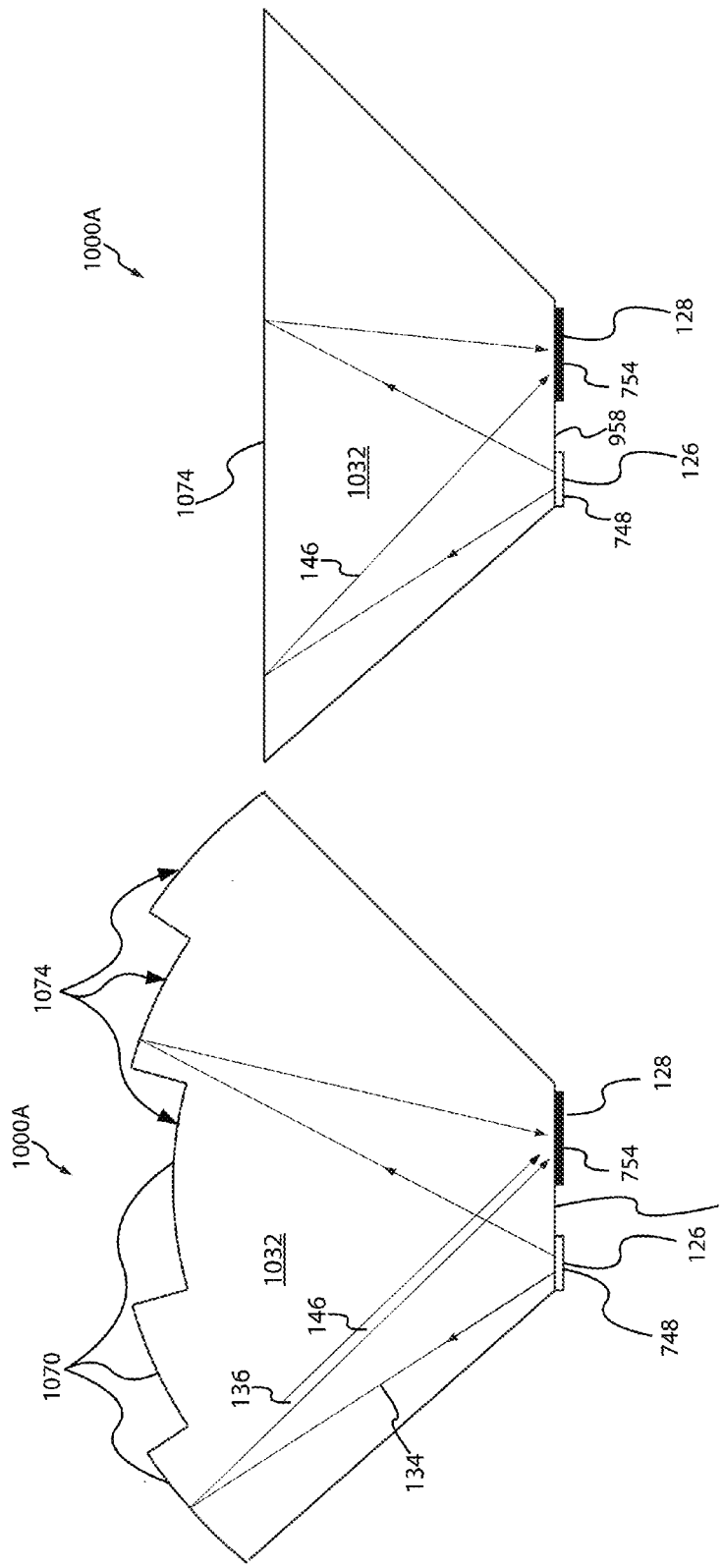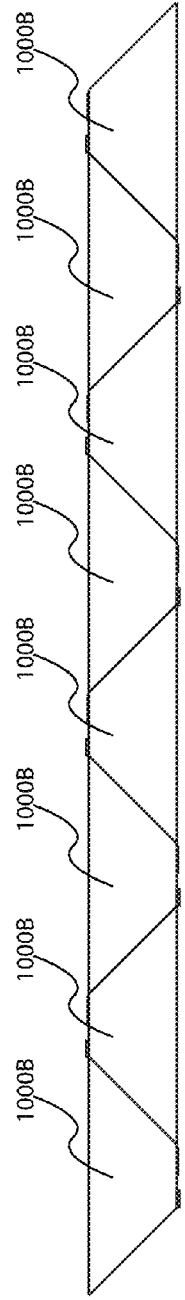

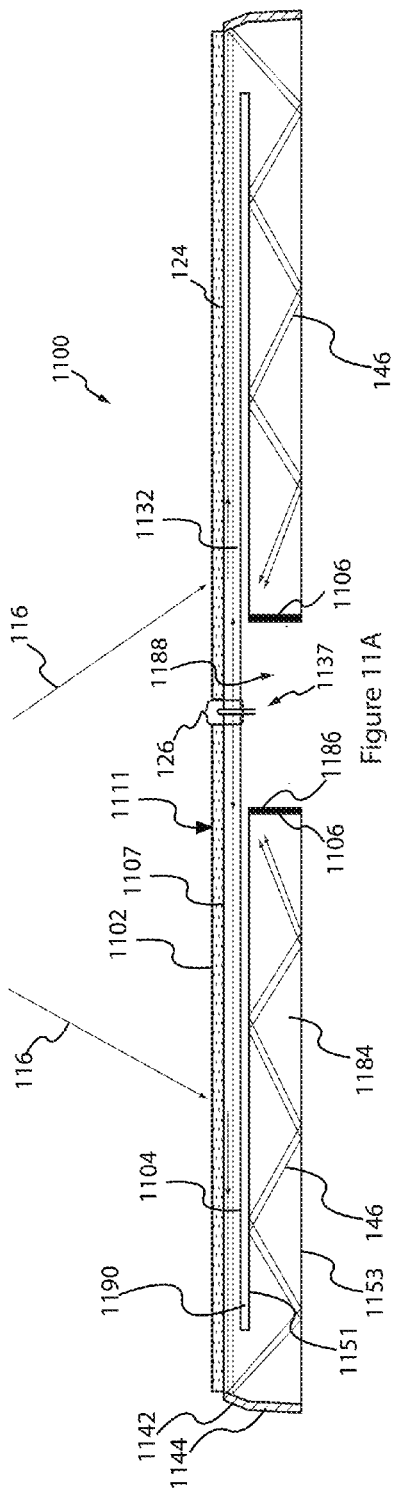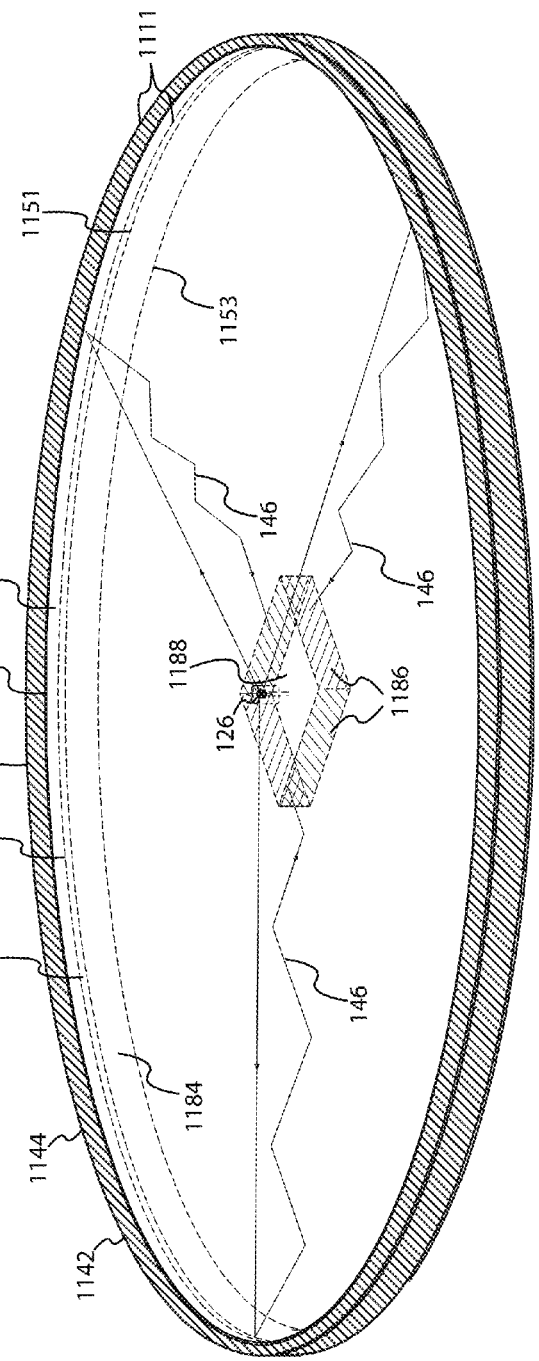

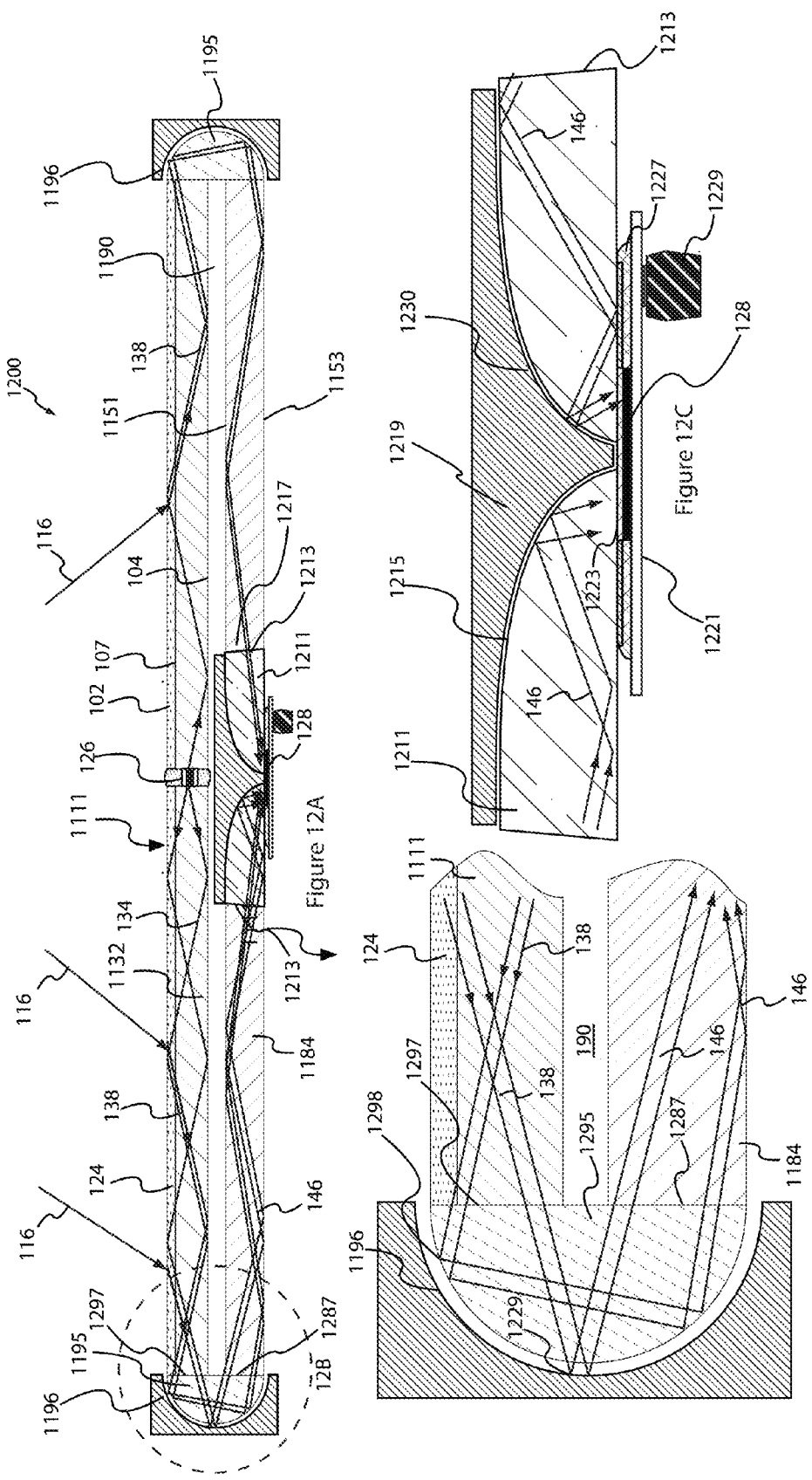

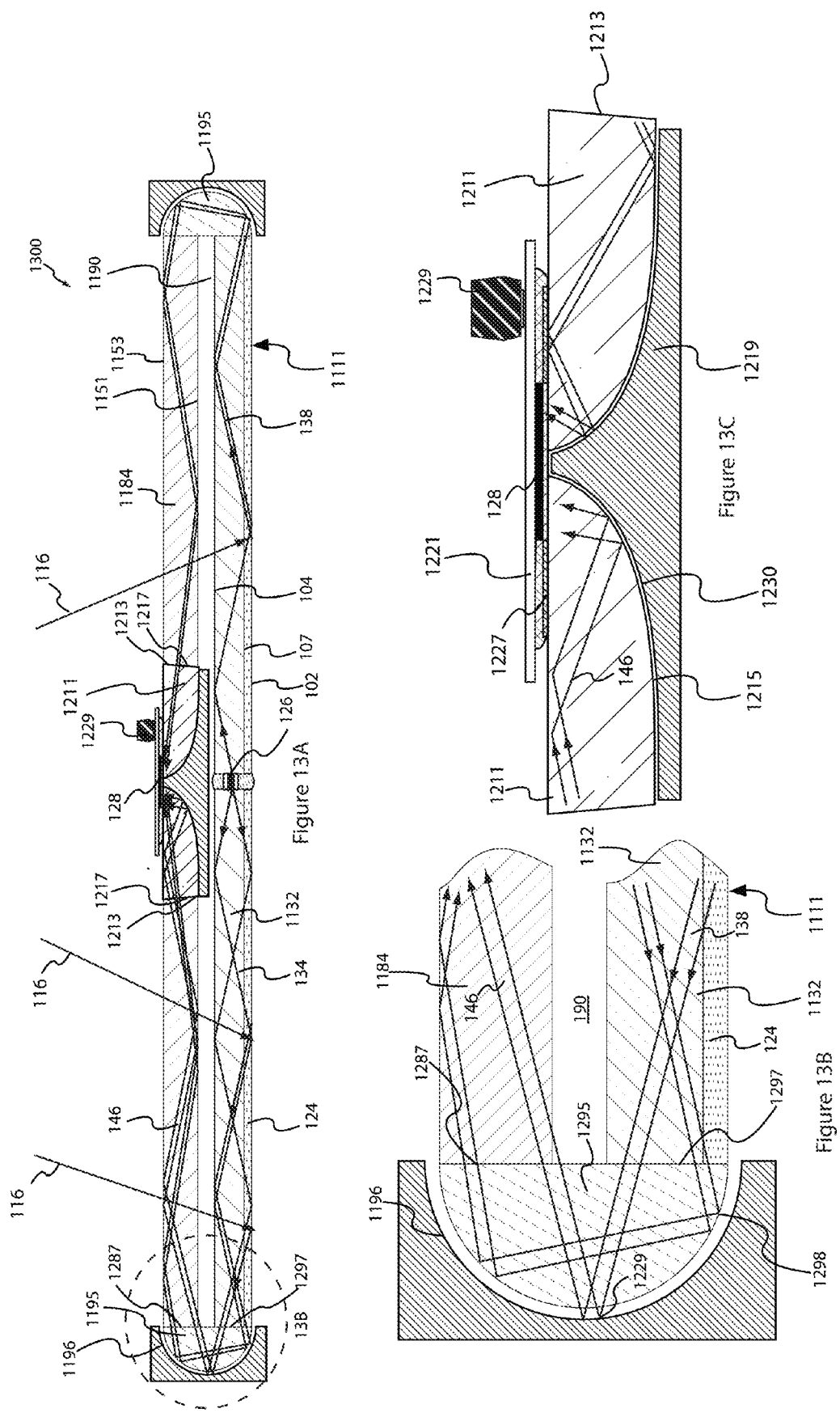

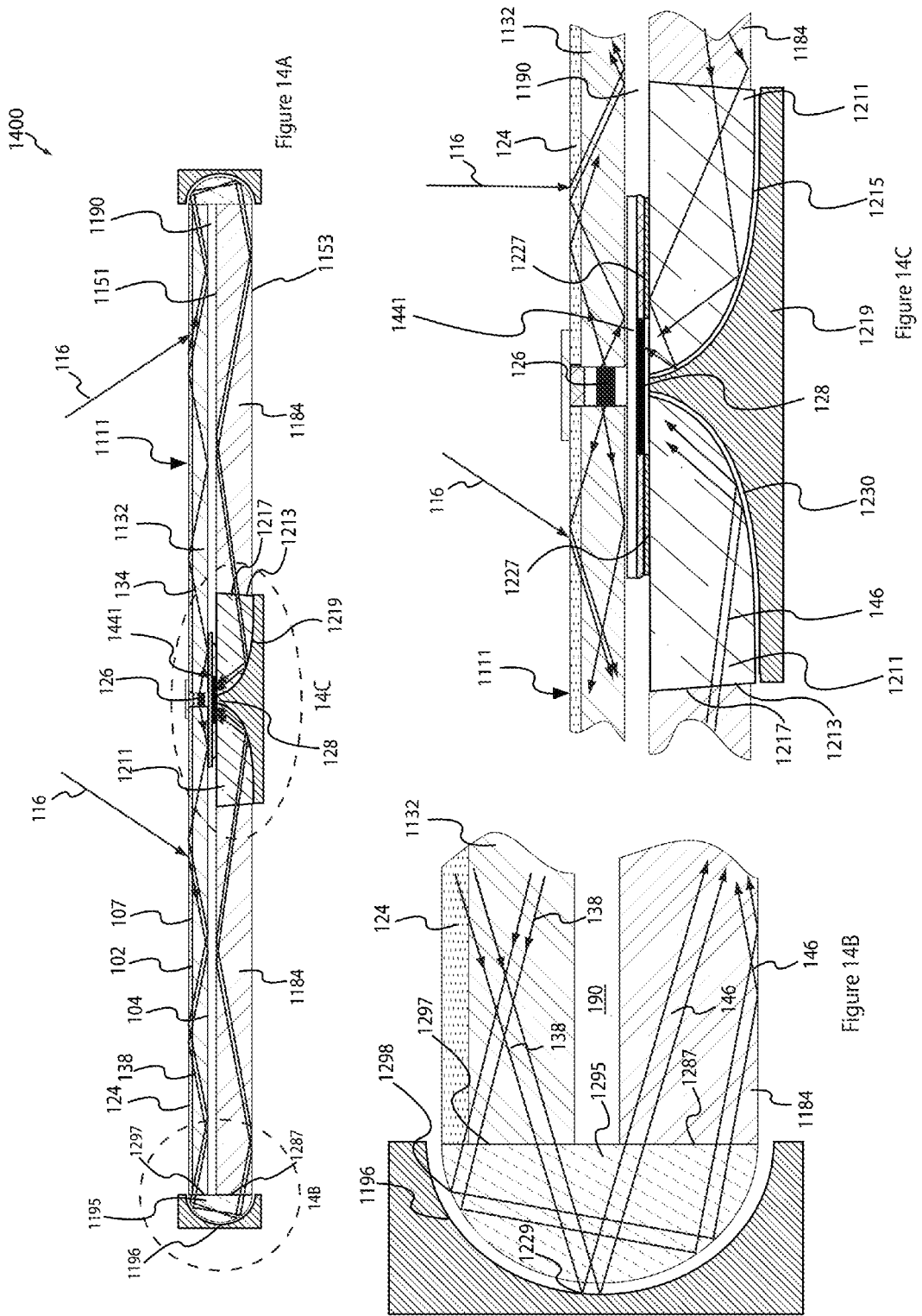

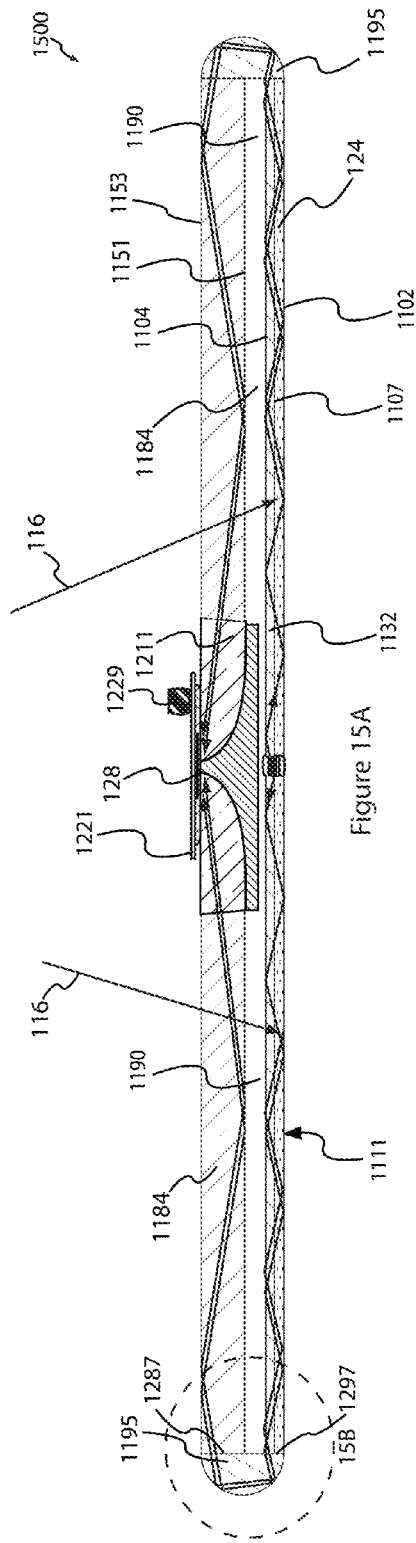
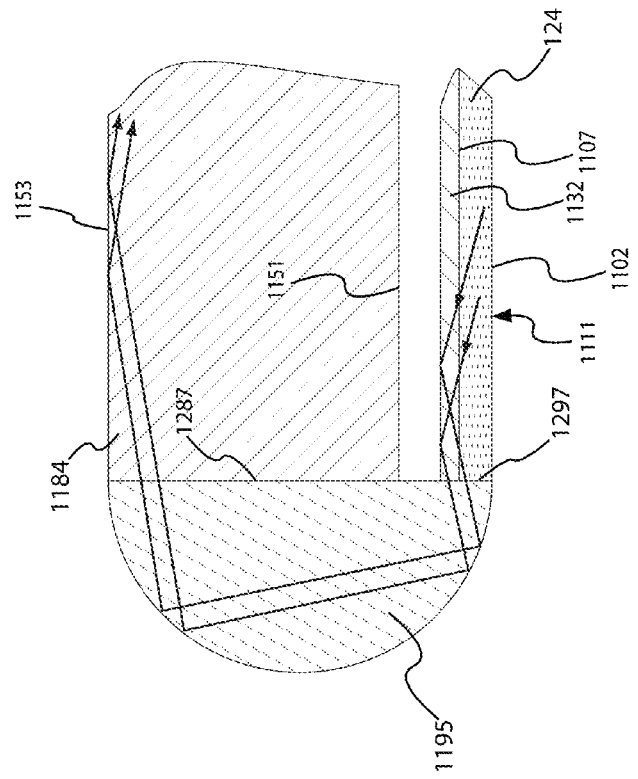
Figure 15A
Figure 15B

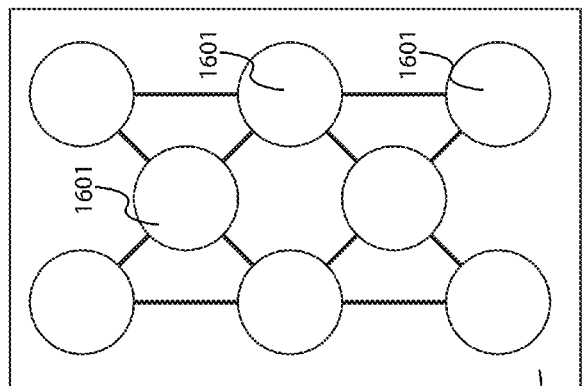
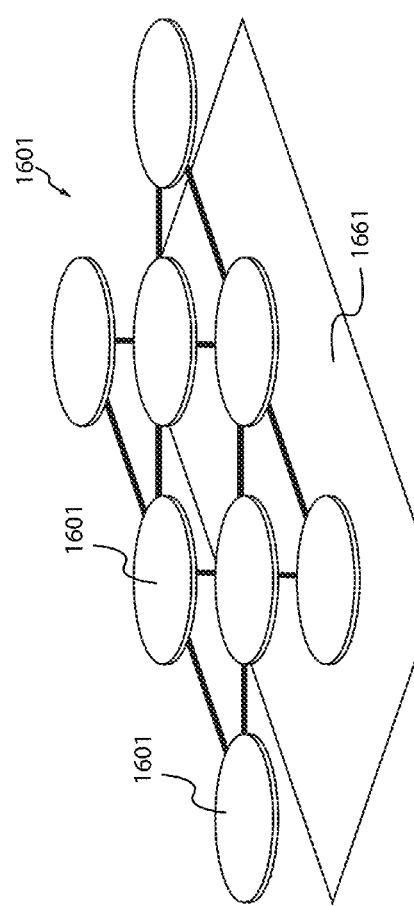
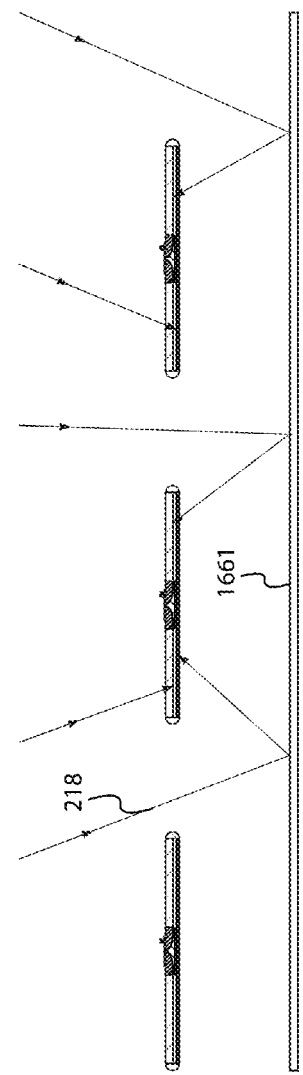

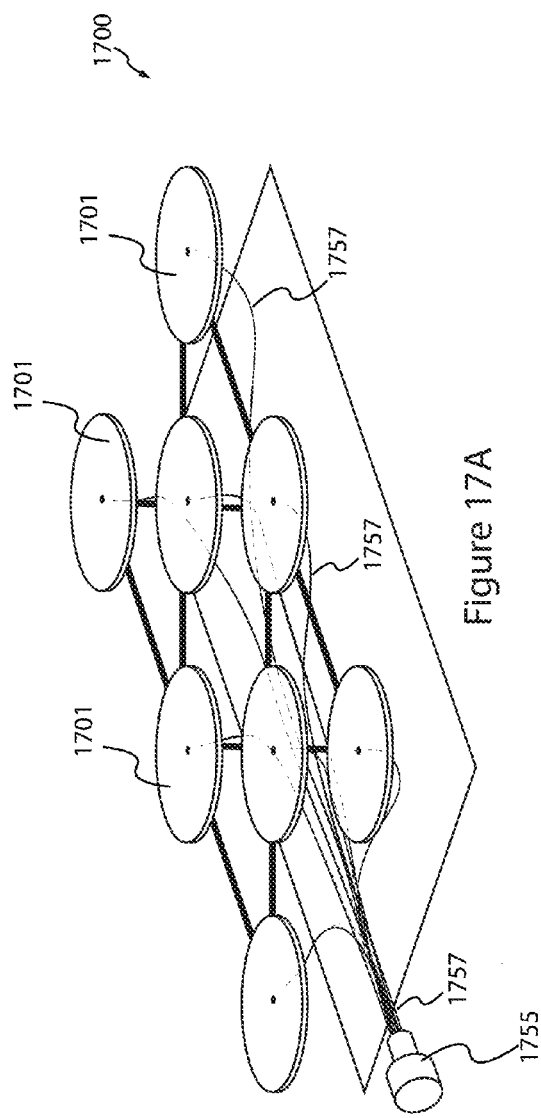
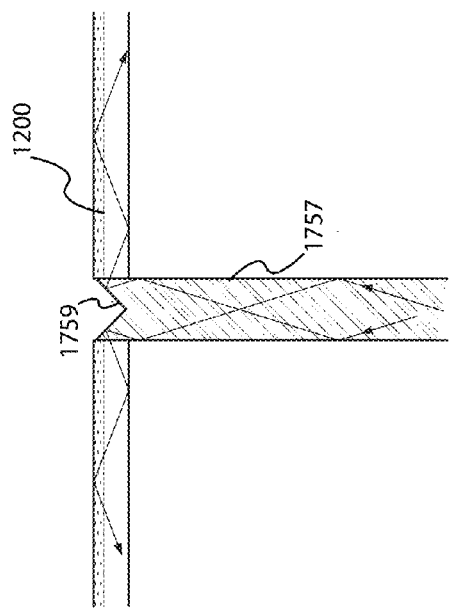

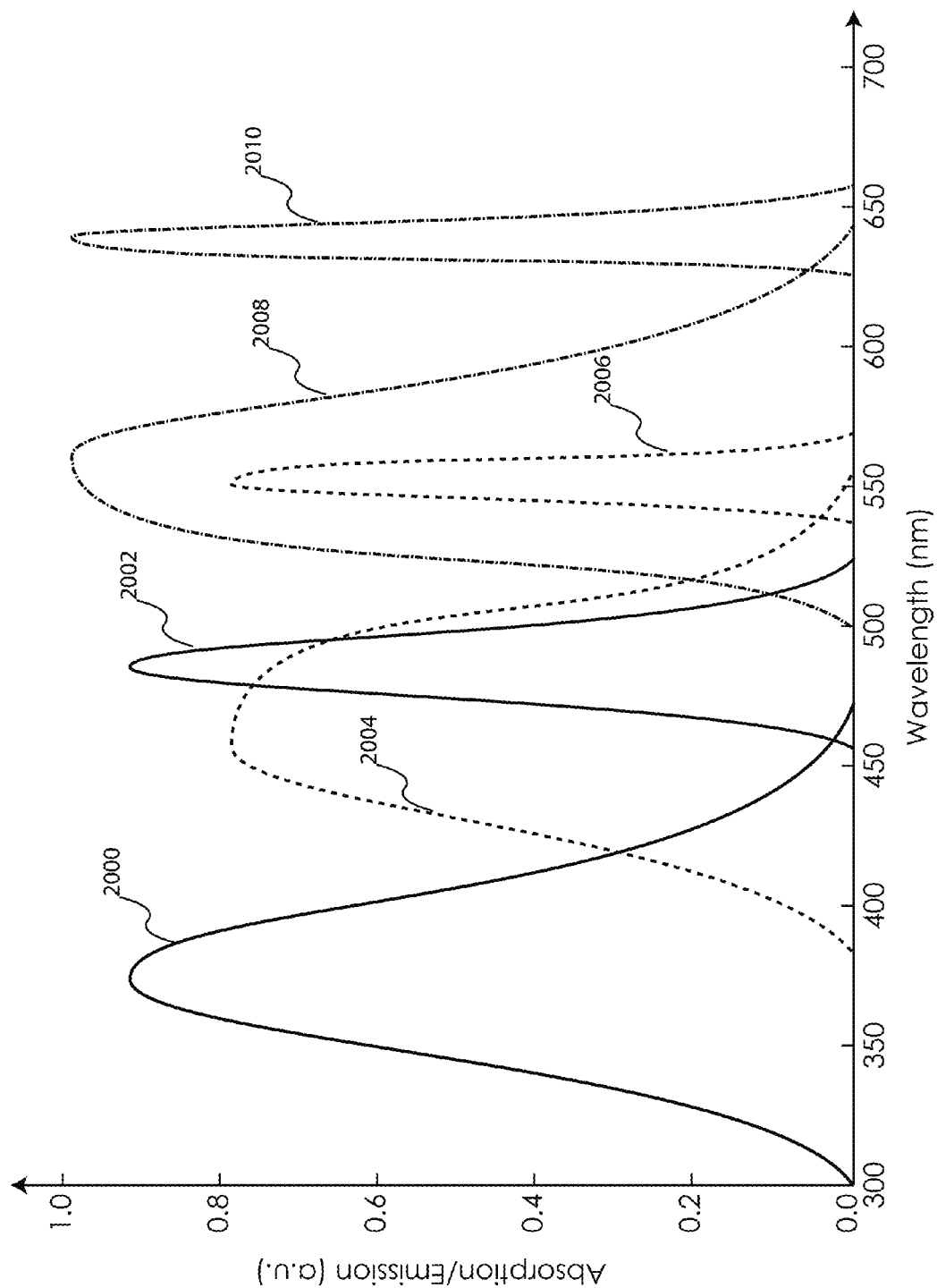

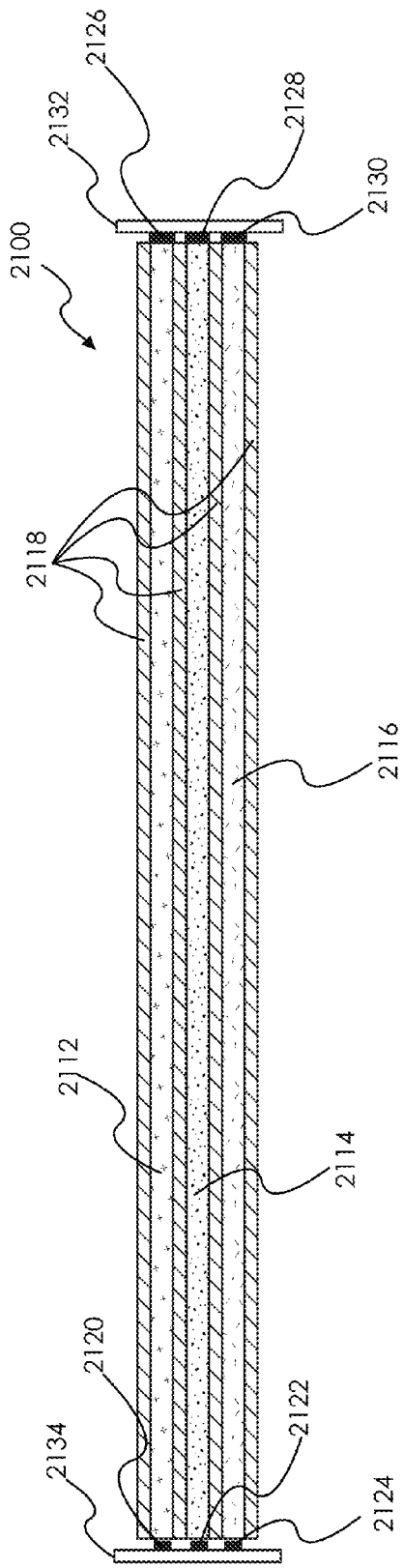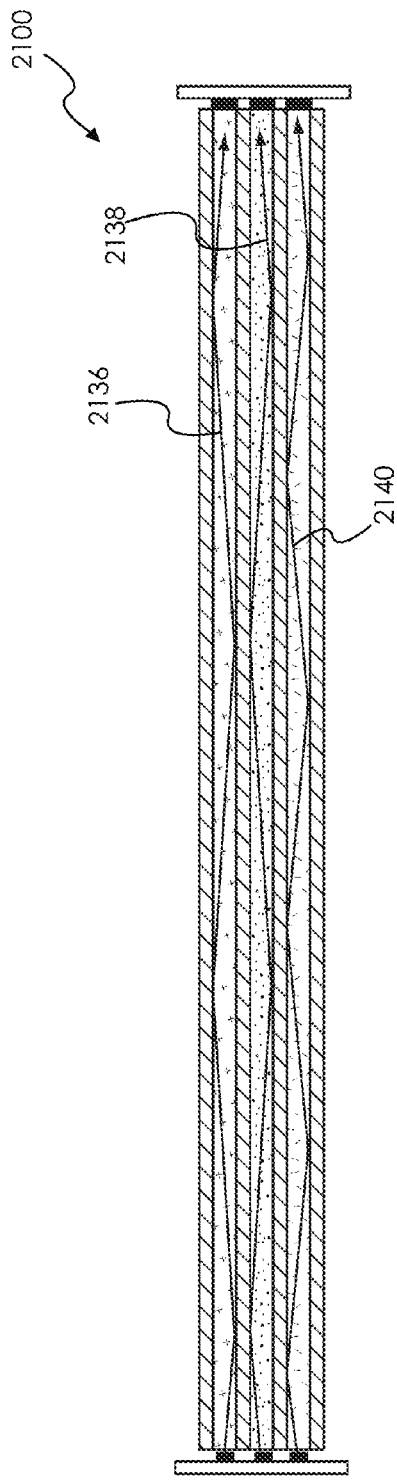
Fig. 21A
Fig. 21B

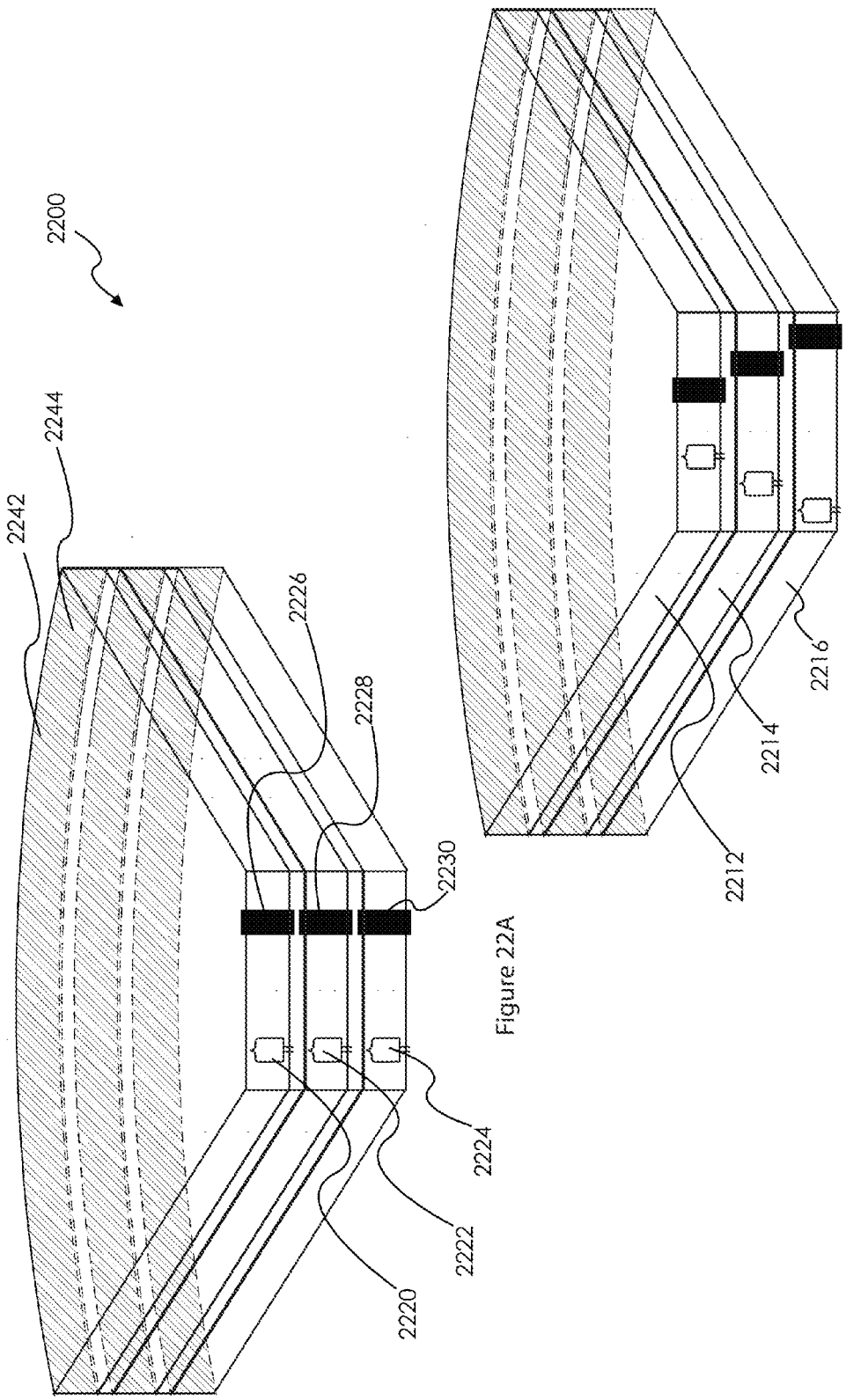

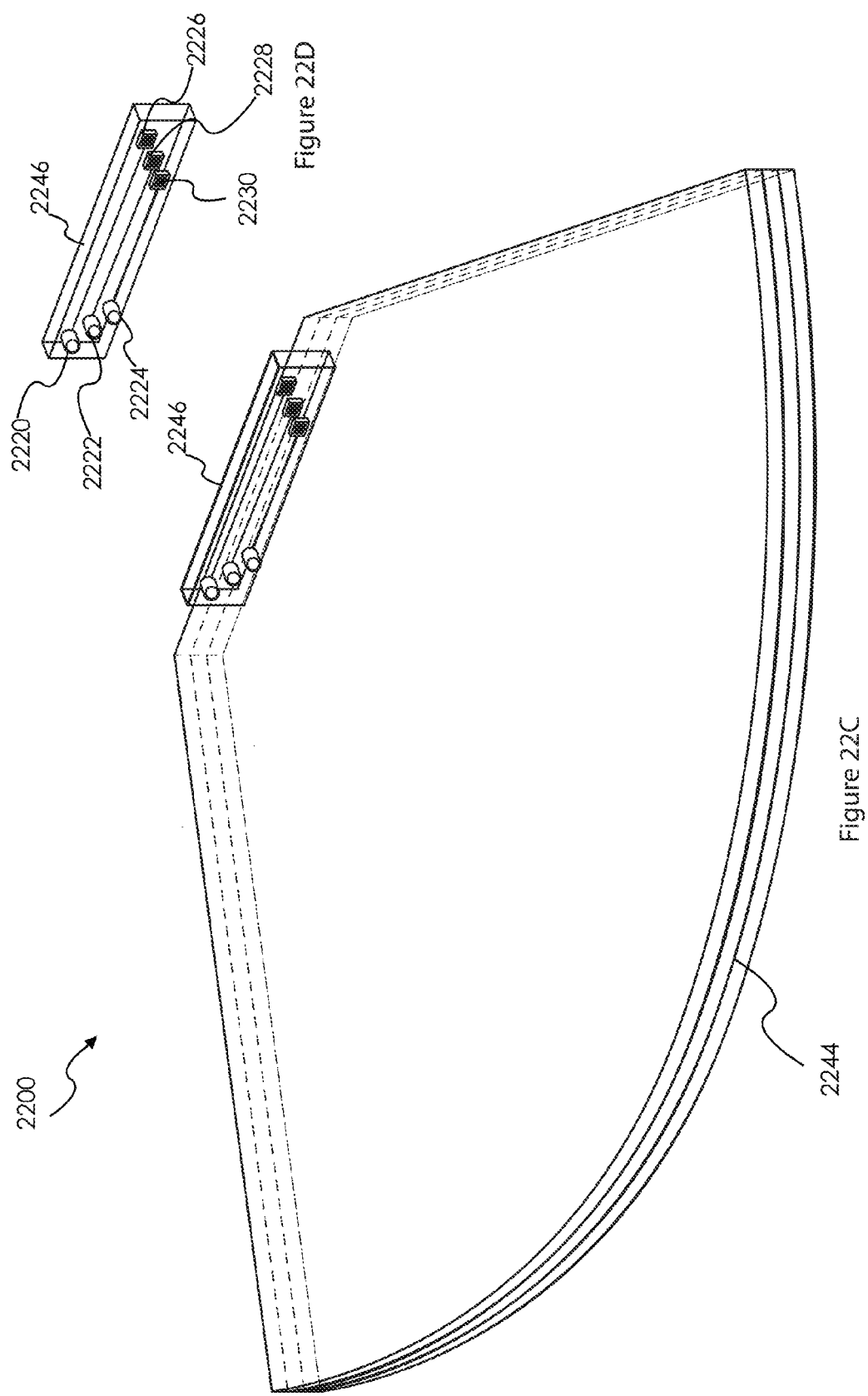

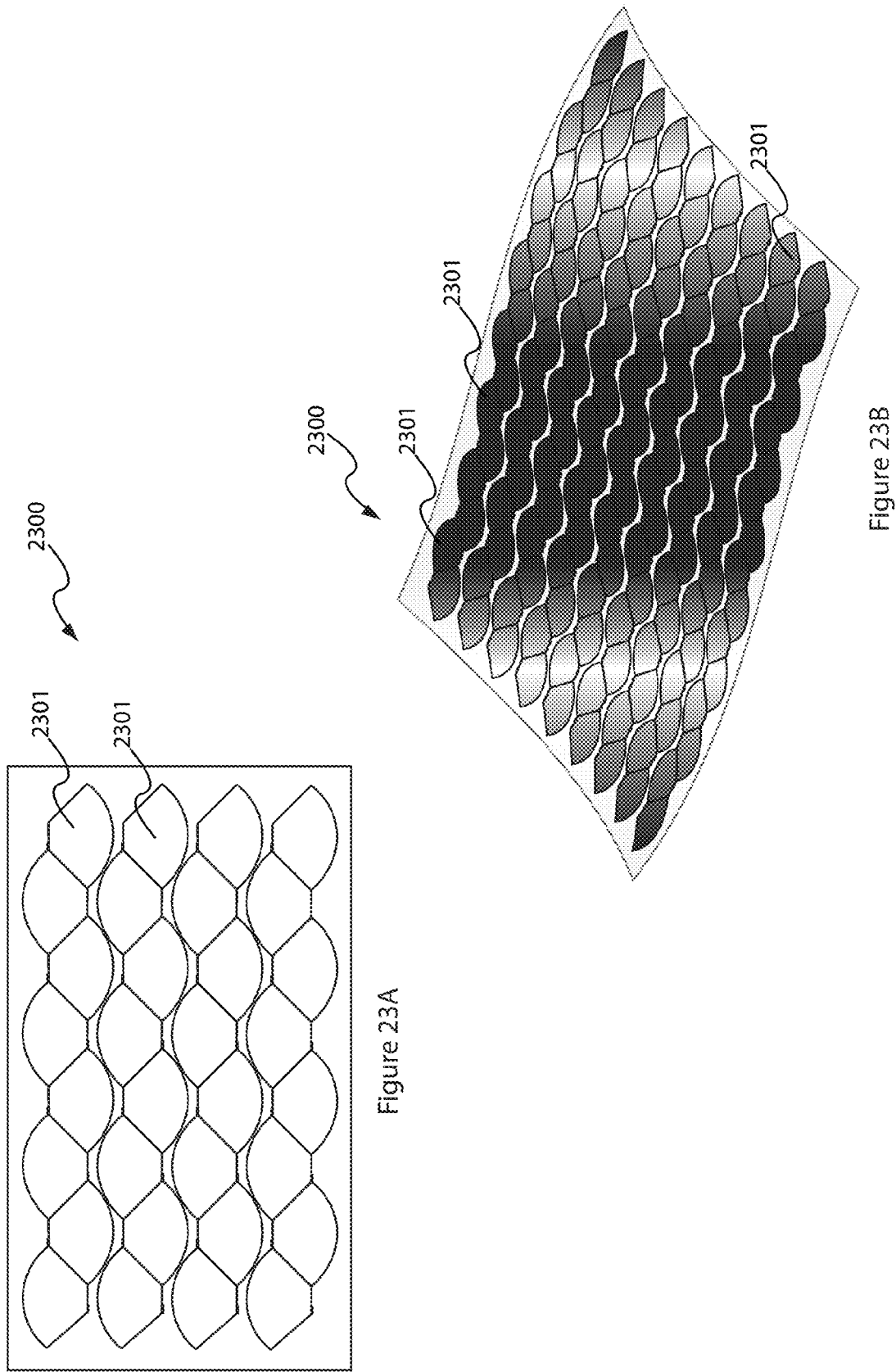

PULSED STIMULATED EMISSION LUMINESCENT PHOTOVOLTAIC SOLAR CONCENTRATOR

CROSS-REFERENCE TO RELATED APPLICATIONS

The present application claims priority to U.S. Provisional Patent Application No. 61/477,265, filed Apr. 20, 2011, entitled "Pulsed Stimulated Emission Luminescent Light-Guide Solar Concentrators". The entirety of this document is incorporated herein by reference.

FIELD

The present invention relates to luminescent solar concentrators.

BACKGROUND

The harvesting of solar energy is a field with a multiplicity of different technologies for converting sunlight to electricity. To date, none of the technologies has become sufficiently inexpensive to displace traditional means of generating electricity, and as a result solar energy remains a marginal contributor to global power needs. The main cost driver in solar power systems is the high cost of the photovoltaic (PV) cells, which are the semiconductor junctions that convert light into electricity.

One of the many avenues being investigated for reducing the cost of electricity produced by solar power is called "Concentrated Photovoltaics", or CPV. The basic idea behind CPV is to use some sort of optic, generally a Fresnel lens or another focusing optic, to concentrate sunlight onto tiny, high-efficiency PV cells. The PV cells employed are compound semiconductor cells with multiple junctions in a stack and electrically connected in series. The most typical conventional cells for CPV are three junction cells using indium gallium phosphide, indium gallium arsenide, and germanium cells all arranged in an electrical series connection. Each of these cells converts a portion of the solar spectrum into electricity. CPV systems are very energetically productive but they have a major downside in that they require trackers to orient them to face the sun at all times in order for their optics to function. This need for trackers makes these systems practical for use in solar farms, where large post-mounted trackers are mounted on the ground. Trackers are impractical, however, for systems intended for building integration and roof mounting (which represents a massive portion of the solar market). CPV systems use high sunlight concentration, as high as 2000 suns, meaning that only a tiny amount of photovoltaic material would be required as compared with a conventional non-concentrated PV system.

Another approach to concentration is the use of luminescent solar concentrators. These devices consist of a sheet of glass that contains either a layer of luminescent particles or has luminescent particles impregnated throughout the glass. Luminescent particles typically absorb light over a wide band of frequencies and emit light at lower frequencies over a narrower band. Examples of luminescent particles are organic dyes, laser dyes and nano-crystals.

When these luminescent particles emit light, the light emitted travels in a random direction. Because this light is emitted evenly in every direction from inside the glass, any emitted radiation which strikes the top or bottom faces of the glass sheet, and which has an angle of incidence with respect to the surface normal of the glass sheet greater than the critical angle for total internal reflection, will be trapped within the glass sheet by total internal reflection. (If the glass has an index of 1.5 and the surrounding media is air then the critical angle is approximately 41.8 degrees.)

In fact, the only light which will not become trapped within the glass is any light that is emitted within one of two cones of emission centered on the normal of the top and bottom glass surfaces and with base angles of 83.6 degrees in the foregoing example. The critical angle is given by Snell's law:

$$n_1 \sin\theta_1 = n_2 \sin\theta_2$$

Light thus trapped will travel in all directions within the glass to the four edges of the glass where it can be harvested for energy production by photovoltaic cells. Because the frequency of the emitted light is relatively narrow, it is possible to use single junction cells in this instance in a very efficient manner, provided the single junction cells have a band-gap closely matched to the energy of the emitted photons. In principal, infinite concentration could be achieved in this manner except there are two fundamental limitations: absorption within the glass and re-absorption by the luminescent particles. The first, absorption within the glass itself, limits the practical optical path length and thus the size of the glass sheet and the concentration. Re-absorption and emission also limit the practical concentration. To date the best-predicted concentration by this means is on the order of 150 suns. This is far lower that the concentrations achievable by CPV as noted above. Thus cost savings in a luminescent concentration system achieved by not having a tracker are greatly overwhelmed by the extra cost of requiring several times more photovoltaic cell material. Thus, luminescent concentration systems are not in widespread commercial use and improvements in this technology are desirable, given its inherent advantages noted above.

SUMMARY

It is thus an object of the present invention to provide an improved luminescent solar concentrator as compared with at least some of those of the prior art.

In one aspect, a solar concentrator is provided. The solar concentrator comprises: a light-transmissive sheet including: a plurality of luminescent particles capable of becoming excited by absorbing light within at least a first spectrum of absorption frequencies and, once excited, capable of being stimulated to emit light having a spectrum within at least a first spectrum of emission frequencies and a first light-guide. Also included in the concentrator is at least one light source for generating a pulsed probe light having a spectrum, at least a portion of which is within at least the first spectrum of emission frequencies, for stimulating at least one of the excited luminescent particles having absorbed light within the first spectrum of absorption frequencies such that when the probe light traveling in a first direction of travel stimulates the excited luminescent particles, the excited luminescent particles emit emitted light having a spectrum within the first spectrum of emission frequencies in the first direction of travel of the probe light. The first light-guide is for assisting in guiding the emitted light and the probe light via total internal reflection. The emitted light and the pump light are concentrated and converging, within the solar concentrator, toward a light collection area.

In some embodiments, the pulsed probe light is generated by turning each of the at least one light source on and off. In some embodiments, each of the at least one light source is a constant light source, and the pulsed probe light is generated by shuttering each constant light source.

In some embodiments, the solar concentrator is generally of a shape selected from the group consisting of a circular disk, an elliptical disk, a section of an elliptical disk, a plurality of sections of elliptical disks forming a reflecting edge of many reflecting facets. If the shape is a circular disk, the circular disk has a focal point, and the at least one light source and the light collection area are substantially at the focal point. If the shape is an elliptical disk, the elliptical disk has two foci, and the at least one light source is at one of the foci and the light collection area is at the other of the foci. If the shape is a section of an elliptical disk, the section of the elliptical disk has two foci on an edge thereof, and the at least light source is at one of the foci and the light collection area is at the other of the foci. If the shape is a plurality of sections of elliptical disks, each of the plurality of sections of elliptical disks have two foci in common with each of the other plurality of sections of elliptical disks, and the at least one light source is at one of the common foci and the light collection area is at the other of the common foci.

In some embodiments, the solar concentrator is disk-shaped and comprises a first parabolic portion facing a second parabolic portion, the first parabolic portion having a first focal point, the second parabolic portion having a second focal point. The at least one light source is at the first focal point and the light collection area is at the second focal point.

In some embodiments, the solar concentrator further includes at least one secondary optic adjacent at least one of the light collection area and the at least one light source. In some embodiments, the at least one secondary optic is made of a different material than adjacent materials.

In some embodiments, the solar concentrator further includes a first reflector positioned at an edge of the light-guide so as to reflect light toward the light collection area.

In some embodiments, the solar concentrator further includes a second light-guide optically coupled to the sheet, the second light-guide for guiding light received from the sheet to the light collection area. The sheet and the second light-guide are stacked one upon the other and separated from one another by a first material having a lower index of refraction than that of both the sheet and the second light-guide. A macroscopic direction of travel of light within the sheet and a macroscopic direction of travel of light within the second light-guide is generally opposite one another.

In some embodiments, the sheet includes a transparent substrate and the luminescent particles are a luminescent dye impregnated in the substrate.

In some embodiments, the luminescent particles are within a luminescent layer adjacent to and optically coupled with the first light-guide.

In some embodiments, light is reflected from an edge of the light-guide via total internal reflection toward the light collection area.

In some embodiments, the solar concentrator further includes a fiber optic for collecting light from the light collection area and re-inserting the light into the concentrator, such that the at least one light source is the fiber optic.

In another aspect, a photovoltaic solar concentrator is provided which includes a solar concentrator and at least one photovoltaic cell disposed at the light collection area of the solar concentrator. In some embodiments of the photovoltaic solar concentrator, the at least one light source and the at least one photovoltaic cell are disposed on a single circuit board. In some embodiments of the photovoltaic solar concentrator, the at least one light source is powered by energy from the at least one photovoltaic cell.

In an additional aspect, a solar concentrator module is provided. The solar concentrator module includes at least two solar concentrators, each concentrator being adjacent to and optically coupled with the other concentrators. The luminescent particles of each of the concentrators are capable of becoming excited by absorbing light within a spectrum of absorption that includes, at least in part, different frequencies from the other concentrators and capable of being stimulated to emit light of at least one frequency within a spectrum of emission frequencies that is, at least in part, different from the other concentrators. Also included is at least one photovoltaic cell disposed at each of the light collection areas of the concentrators.

In some embodiments of the solar concentrator module, the at least two solar concentrators are separated from one another by a second material having a lower index of refraction than that of the at least two solar concentrators.

In another aspect, a solar energy collector assembly is provided, comprising a plurality of solar concentrators. At least two light sources of the concentrators are in optical communication with a central light source such that the at least two light sources emit probe light generated by the central light source.

In yet another aspect, a method of concentrating light is provided. The method includes: (i) exposing at least one light-transmissive sheet, having a plurality of luminescent particles and at least one light-guide, to light, causing the luminescent particles to become excited by absorbing light within at least a first spectrum of absorption frequencies, the excited luminescent particles capable of being stimulated to emit emitted light having a spectrum within at least a first spectrum of emission frequencies; (ii) stimulating the excited luminescent particles via pulsed probe light, the pulsed probe light having a spectrum, a portion of which is within at least the first spectrum of emission frequencies, and traveling in a first direction, to cause the excited luminescent particles to emit emitted light having a spectrum within the first spectrum of emission frequencies in the first direction of travel of the probe light; and (iii) concentrating and converging the emitted light and the probe light via total internal reflection in the at least one light-guide toward a light collection area.

Embodiments of the present invention each have at least one of the above-mentioned object and/or aspects, but do not necessarily have all of them. It should be understood that some aspects of the present invention that have resulted from attempting to attain the above-mentioned object may not satisfy this object and/or may satisfy other objects not specifically recited herein.

Additional and/or alternative features, aspects, and advantages of embodiments of the present invention will become apparent from the following description, the accompanying drawings, and the appended claims.

BRIEF DESCRIPTION OF THE DRAWINGS

For a better understanding of the present invention, as well as other aspects and further features thereof, reference is made to the following description which is to be used in conjunction with the accompanying drawings, where:

FIG. 1 shows a simplified overview of a luminescent system;

FIG. 2A is a cross sectional view of a first embodiment of a pulsed stimulated emission luminescent light-guide solar concentrator;

FIG. 2B is a cross sectional views a second embodiment of a pulsed stimulated emission luminescent light-guide solar concentrator;

FIG. 6A is a cross sectional view of another embodiment of a circular disk-shaped embodiment of a pulsed stimulated emission luminescent light-guide solar concentrator;

FIG. 6B is a perspective view of the circular disk-shaped embodiment of a pulsed stimulated emission luminescent light-guide solar concentrator of FIG. 6A;

FIG. 6C is a plan view of the circular disk-shaped embodiment of a pulsed stimulated emission luminescent light-guide solar concentrator of FIG. 6A;

FIG. 8A is a perspective view of an embodiment of a half elliptical disk-shaped pulsed stimulated emission luminescent light-guide solar concentrator;

FIG. 8B is a plan view of the half elliptical disk-shaped pulsed stimulated emission luminescent light-guide solar concentrator of FIG. 8A;

FIG. 9A is a perspective view of an embodiment of an elliptical section disk-shaped pulsed stimulated emission luminescent light-guide solar concentrator;

FIG. 9B is a plan view of the elliptical section disk-shaped pulsed stimulated emission luminescent light-guide solar concentrator of FIG. 9A;

FIG. 10A is a plan view of an embodiment of a pulsed stimulated emission luminescent light-guide solar concentrator having multiple reflecting facets;

FIG. 10B is a plan view of an embodiment of a pulsed stimulated emission luminescent light-guide solar concentrator having many small reflecting facets which forms a peripheral reflective edge that appears to be generally planar;

FIG. 10C is a plan view of a solar array comprising a plurality of tightly packed pulsed stimulated emission luminescent light-guide solar concentrators of the type shown in FIG. 10B;

FIG. 11A is a cross sectional view of an embodiment of a bi-layer pulsed stimulated emission luminescent light-guide solar concentrator;

FIG. 11B is a perspective view of the bi-layer pulsed stimulated emission luminescent light-guide solar concentrator of FIG. 11A;

FIG. 12A is a cross sectional view of another embodiment of a bi-layer pulsed stimulated emission luminescent light-guide solar concentrator with a secondary light-guide;

FIG. 12B is a detailed cross sectional view of a semi-circular optic of the bi-layer pulsed stimulated emission luminescent light-guide solar concentrator of FIG. 12A;

FIG. 12C is a detailed cross sectional view of the secondary optical element of the bi-layer pulsed stimulated emission luminescent light-guide solar concentrator of FIG. 12A;

FIG. 13A is a cross sectional view of an embodiment of an inverted bi-layer pulsed stimulated emission luminescent light-guide solar concentrator that allows for mounting of a solar energy collector and a light source on the same circuit board;

FIG. 13B is a detailed cross sectional view of a semi-circular optic of the inverted bi-layer pulsed stimulated emission luminescent light-guide solar concentrator of FIG. 13A;

FIG. 13C is a detailed cross sectional view of the secondary optical element of the inverted bi-layer pulsed stimulated emission luminescent light-guide solar concentrator of FIG. 13A;

FIG. 14A is a cross sectional view of another embodiment of a bi-layer pulsed stimulated emission luminescent light-guide solar concentrator that allows for mounting of a solar energy collector and a light source on the same circuit board;

FIG. 14B is a detailed cross sectional view of a semi-circular optic of the bi-layer pulsed stimulated emission luminescent light-guide solar concentrator of FIG. 14A;

FIG. 14C is a detailed cross sectional view of the central portion of bi-layer pulsed stimulated emission luminescent light-guide solar concentrator of FIG. 14A;

FIG. 15A is a cross sectional view of an embodiment of circular disk-shaped bi-layer stimulated emission luminescent light guide solar concentrator having a thin luminescent sheet;

FIG. 15B is a detailed cross sectional view of a semi-circular optic of the bi-layer pulsed stimulated emission luminescent light-guide solar concentrator of FIG. 15A;

FIG. 16A is a perspective view of a stimulated emission solar concentration assembly;

FIG. 16B is a plan view of the stimulated emission solar concentration assembly of FIG. 16A;

FIG. 16C is a cross sectional view of the stimulated emission solar concentration assembly of FIG. 16A;

FIG. 17A is a perspective view of the stimulated emission solar concentration assembly of FIG. 16A with a central light source;

FIG. 17B is a detailed cross sectional view of the emitting end of an optical fiber which conducts light from the central light source;

FIG. 20 is an illustrative graph of a set of absorption and emission spectra of three luminescent materials;

FIGS. 21A and 21B are a cross sectional views of an embodiment of a multi-layer pulsed stimulated emission luminescent light guide solar concentrator;

FIG. 22A is a perspective view of an embodiment of a pie-shaped three-layer pulsed stimulated emission luminescent light guide solar concentrator where the light sources and solar energy collectors are vertically aligned;

FIG. 22B is a perspective view of an embodiment of a pie-shaped three-layer pulsed stimulated emission luminescent light guide solar concentrator similar to that of FIG. 22A where the light sources and solar energy collectors are vertically misaligned;

FIG. 22C is another perspective view of the pie-shaped three-layer pulsed stimulated emission luminescent light guide solar concentrator of FIG. 22B;

FIG. 22D is a perspective view of the light sources and solar energy collectors of FIG. 22B mounted on a single substrate;

FIG. 23A is a plan view of a solar panel assembly;

FIG. 23B is a perspective view of the flexible solar panel assembly of FIG. 23A;

DETAILED DESCRIPTION

Figure 3:
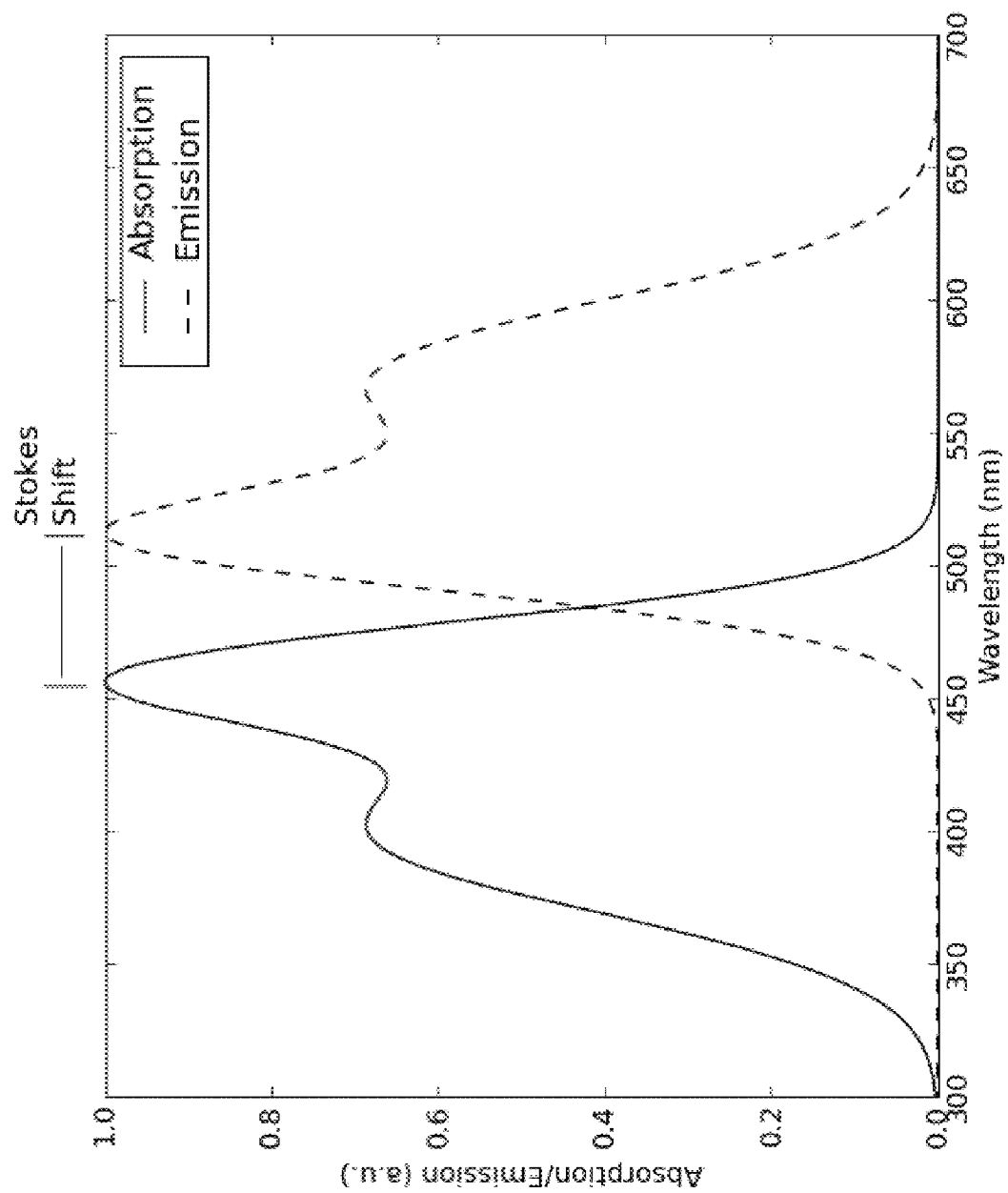
FIG. 3 is an Absorption Emission Spectrum of a typical dye.

In stimulated emission luminescent solar concentrators, a luminescent sheet is pumped by sunlight and is probed by a light source, such as a laser, a diode or other light source, to stimulate emission of photons which can be harvested by photovoltaic cells. FIGS. 1A-1G illustrate the stimulated emission process in a luminescent particle showing the energy states of electrons during the process. FIG. 1A shows an incident photon 10 from sunlight 116 being absorbed by a luminescent particle 26 resulting in an electron 12 of the luminescent particle 26 being excited from the ground state 14 ($E_0$) into a higher energy state 16 ($E_H$). FIG. 1B shows the electron 12 decaying to a lower energy state 18 ($E_L$), by releasing some of the energy gained from the absorbed photon 10 as light or heat 11. The lower energy state ($E_L$) 18 is herein referred to as the luminescent state 18 (also known in the art as a metastable excited state). An electron 12 left alone in the luminescent state 18 for a long enough period of time, will spontaneously decay back to the ground state 14 with the spontaneous emission of a photon in a random direction. The frequency of the spontaneously emitted photon, called the luminescent frequency, is lower than the frequency of the originally absorbed photon 10 as the emitted photon has less energy than the absorbed photon 10. FIG. 1C shows a probe photon 22 having a frequency equal to the luminescent frequency incident on the luminescent particle 26 having an electron 12 in the luminescent state 18. As shown in FIG. 1D, this probe photon 22 will perturb (stimulate) the electron 12 in the luminescent state 18 and cause it to decay to the ground state 14, with the stimulated emission of a photon 24. The photon 24 emitted by stimulated emission has the same frequency, phase, and direction of travel as the probe photon or stimulating photon 22.

FIG. 1E is a schematic illustration of the stimulated emission process in luminescent particles. Sunlight 116 strikes a cluster of luminescent particles 26 (single or several molecules). The sunlight 116 acts as a pump light exciting electrons 12 of the luminescent particles as described above. A passing probe beam 28 having a frequency equal to the luminescent frequency stimulates the decay of the excited electrons 12 causing the luminescent particles 26 to emit a beam 30 parallel to the probe beam 28 and with the same frequency as the probe beam 28. The probe beam 28 and the beam 30 created by stimulated emission continue to propagate in the same direction.

The luminescent state 18 described above is only one example of an excited energy state of a luminescent particle, and in fact the stimulated emission process can be more complicated. The process may involve continuous or pseudo-continuous energy bands instead of discrete states, in which case, the spontaneous emission has a luminescent spectrum instead of luminescent frequency, and the probe beam from a light source such as a diode would have the same spectrum as the luminescent spectrum. In other words, the light in question (probe or emitted), has frequencies varying over a narrow band and defining a spectrum, rather than being at a particular, precise frequency.

Multiple energy states of the luminescent system can be involved in the stimulated emission process. Multiple photons can be involved in the excitation step, and there can be multiple decay steps prior to the luminescent emission step. The present disclosure is intended to cover any luminescent system, irrespective of the number of energy states. Additionally, some luminescent particles contain multiple luminescent particles with different absorption and emission spectra where the emission from one particle is absorbed by another particle. This disclosure is intended to cover those luminescent systems as well.

It should be noted that the word "dye" in the present specification refers to a luminescent material, including, but not limited to organic and inorganic dyes, doped glasses and crystals (e.g. $Nd^{3+}$ in Yttrium aluminium garnet (YAG) or glass; titanium in sapphire), quantum dots, and nano-crystals. In should also be noted that luminescence in the present application is used to refer in short-form to photoluminescence.

The probability that an excited dye molecule will decay via stimulated emission is given by the ratio of the rate of stimulated emission to the total relaxation rate:

$$p_{stim} = R_{stim}/(R_{stim}+R_{sp})$$

where $p_{stim}$ is the probability of stimulated emission, $R_{stim}$ is the rate of stimulated emission, and $R_{sp}$ is the rate of spontaneous emission. The rate of stimulated emission is given by:

$$R_{stim} = \sigma_e I/h\nu$$

where $\sigma_e$ is the stimulated emission cross-section at the probe wavelength, I is the intensity of the incident light, h is Planck's constant, and v is the frequency of the light. The rate of spontaneous emission, $R_{sp}$, is given by the inverse of the luminescent state lifetime $\tau_{sp}$ as in $$R_{sp} = 1/\tau_{sp}.$$

Dye molecules decay through non-radiative as well as radiative mechanisms, resulting in a luminescence quantum yield (QY) less than unity. The non-radiative mechanism can be a probabilistic splitting between pathways from a high energy singlet state during the initial relaxation, with some probability QY that the radiative path was taken, and probability 1−QY that the non-radiative path was taken. Alternatively, the non-radiative mechanism can be a relaxation process from the luminescent state that competes with the radiative path, characterized by a non-radiative relaxation rate $R_{nr}$, with the quantum yield given by $QY=R_{sp}/(R_{sp}+R_{nr})$.

In the first case, with a non-radiative path from the highly excited state, the probability of stimulated emission is replaced with:

$$p_{stim}=QY*R_{stim}/(R_{stim}+R_{sp}).$$

In the second case, the probability of stimulated emission is replaced with:

$$p_{stim}=R_{stim}/(R_{stim}+R_{sp}+R_{nr}).$$

Dyes are chosen so that they have a high stimulated emission cross section and high quantum yield.

A first embodiment of a pulsed stimulated emission luminescent light-guide solar concentrator 100 is shown in FIG. 2A. The solar concentrator 100 includes a light-guide 132, a luminescent layer 124 and a pulsed light source 126.

The light-guide 132 is planar and can be made of a light transmissive material. Non-limiting examples of light-transmissive materials include optical polyvinyl chloride (PVC), Poly(methyl methacrylate) (PMMA), silicones, Cyclo-Olefin Polymers (COP), Cyclo-Olefin Copolymers (COC), glasses, epoxy-based materials, urethane materials, other co-polymer materials and other polymeric materials. The light-guide 132 is bounded by a first surface 107, a second surface 104, a coupling surface 108 and an exit surface 106. The light source 126 is optically coupled to the light-guide 132 via the coupling surface 108.

The luminescent layer 124 is a thin sheet or film of light-transmissive material containing luminescent particles 130. The luminescent layer 124 is optically coupled to the first surface 107 of the light-guide 132. Non-limiting examples of light-transmissive materials include optical polyvinyl chloride (PVC), Poly(methyl methacrylate) (PMMA), silicones, Cyclo-Olefin Polymers (COP), Cyclo-Olefin Copolymers (COC), glasses, epoxy-based materials, urethane materials, other co-polymer materials and other polymeric materials. The light-transmissive material of the luminescent layer 124 has a luminescent dye (containing luminescent particles 130) impregnated, evenly or unevenly, throughout the layer 124. Exemplary uneven distributions of luminescent particles in a layer include a distribution with a concentration gradient, for example, a gradient with the concentration of luminescent particles increasing (or decreasing) from the end near the light source 126 towards the end near the exit surface 106. Alternately, or additionally, the concentration gradient of luminescent particles in the luminescent layer 124 can also vary in a direction perpendicular to the first surface 107. The luminescent layer 124 can be created by dissolving the luminescent dye in solution and applying it directly, for example, as a thin film, on the first surface 107 of the light-guide 132. The thickness of the luminescent layer 124 in a direction perpendicular to the first surface 107 of the light-guide 132 can be varied in different regions of the first surface 107, for example, by applying a different number of layers of the luminescent dye solution on the different regions.

The solar concentrator 100 has a light collection surface 102, which in this embodiment is the first surface of the luminescent layer 124. Sunlight 116 incident on the light collection surface 102 enters the solar concentrator 100 and the photons having wavelengths within the absorption spectrum or spectra of the luminescent particles 130 in the luminescent layer 124 are absorbed by the luminescent particles 130. The incident sunlight 116 acts as a pump light exciting the luminescent particles 130 to a luminescent state and creating a population inversion in the luminescent layer 124. An electron of the luminescent particle 130 in a luminescent state can drop to the ground state, either spontaneously or when stimulated by a passing photon. If the excited electron spontaneously drops to the ground state, the luminescent particle emits a photon in a random direction. If the excited electron is stimulated by a passing photon to drop to the ground state, a photon will be emitted that has the same wavelength and is in phase with the stimulating photon, that is, with the probe light 134.

The difference in wavelength between the peak of the absorption and emission profiles is called the Stokes shift. FIG. 3 shows the Stokes shift between the absorption and emission spectra of a luminescent material. A luminescent material with a large Stokes shift and minimal overlap between the absorption and emission spectra can be used to prevent the reabsorption of emitted photons by the luminescent particles. Non-limiting examples of luminescent materials with large Stokes shifts are doped nanoparticles or quantum dots, such as Mn-doped ZnSe, $Eu^{3+}$-doped $Gd_2O_3$, and Te-doped CdSe.

Although there is generally at least some overlap between the absorption and emission spectra of a luminescent material, ideally less than 10% overlap is desired for the purposes of this invention.

The probe light 134 (referred to as pump light in International Application No. PCT/CA2010/000363 and Canadian Patent Application No. 2,658,193) stimulates the emission of photons in the luminescent layer 124. The probe light 134 is transmitted through the main body 131 of the solar concentrator 100 via total internal reflections (TIR) at the second surface 104 of the light-guide 132 and at the light collection surface 102 of the luminescent layer 124. The indices of refraction of the light-guide 132 and the luminescent layer 124 can be matched such that the probe light 134 is coupled from the light-guide 132 to the luminescent layer 124 through the first surface 107 of the light-guide 132. A photon of the probe light 134 which enters the luminescent layer 124 may cause an excited electron of an excited luminescent particle 130 in the luminescent layer 124 to fall into its ground state, thereby releasing a photon having the same frequency, phase, and direction of travel as the stimulating photon of the probe light 134.

A cross section of a second embodiment of a pulsed stimulated emission luminescent light-guide solar concentrator 200 is shown in FIG. 2B. The solar concentrator 200 includes a luminescent light-guide 232 and a pulsed light source 126.

In the embodiment of FIG. 2B, the entire volume of the main body 231 is impregnated with luminescent particles 130. The luminescent particles 130 can be suspended for example in a substrate or matrix of light-transmissive material that forms the main body 231. Non-limiting examples of light-transmissive materials that can be used include optical polyvinyl chloride (PVC), Poly(methyl methacrylate) (PMMA), silicones, Cyclo-Olefin Polymers (COP), Cyclo-Olefin Copolymers (COC), epoxy-based materials, urethane materials, other co-polymer materials, other polymeric materials, or a solvent such as ethanol sealed in a glass enclosure. In some embodiments, the luminescent particles 130 distributed through the entire volume of the main body 231 are clusters of luminescent particles 130. The clusters may be of substantially uniform sizes or of non-uniform sizes.

In this embodiment, the first surface of the light-guide 232 is the light collection surface 102. Sunlight 116 is therefore received by the light-guide 232 directly through the light collection surface 102. The incident sunlight 116 acts as a pump light. The photons of the incident sunlight 116 are absorbed by the luminescent particles 130 in the light-guide 232 and the luminescent particles become excited to a luminescent state. The pulsed probe light 134, which is optically coupled into the light-guide 232 through the coupling surface 108, is transmitted through the light-guide 232 via multiple total internal reflections at the second surface 104 and at the first surface 107 (which is also the light collection surface 102). When a photon of the probe light 134 stimulates an excited luminescent particle 130, an excited electron of the excited luminescent particle 130 will drop to the ground energy state emitting a photon having the same frequency, phase and direction of travel as photons of the probe light 134.

The solar concentrator 100, 200 can be a part of a solar concentrator module in which a solar energy collector 128 is placed in optical communication with the exit surface 106 in a light collection area 127 of the solar concentrator 100, 200 to harvest the solar energy concentrated by the solar concentrator 100, 200, as shown in FIGS. 2A and 2B. The solar energy collector 128 can be, for example, a multi junction photovoltaic cell or a silicon photovoltaic cell, which can be adapted for receiving pulsed light. The solar energy collector 128 can comprise a waveguide (not shown), such as an optical fibre, to guide the concentrated light towards a light harvesting device such as a central photovoltaic cell or solar thermal energy collector.

In the embodiments of FIGS. 2A and 2B, the light source 126 generates a divergent probe light beam 134 that is pulsed on and off. The probe light 134 floods the main body 131, 231 of the solar concentrator 100, 200. The light source 126 can be, for example, a laser diode that emits a wavelength of light within the emission spectrum of the dye. The light source 126 can pulsed by powering the light source 126 on and off, by using a timed shutter (i.e., opening and closing a shutter) or by any other means known in the art. The pulsed laser diode can be coupled to a divergent optical element (not shown). Other narrow band light sources that can be used to generate a pulsed beam of light include LEDs and compact incandescent light sources coupled to narrow band transmission filters. The use of LEDs may be advantageous because they can provide longevity and reduced power consumption.

An excited luminescent particle 130 illuminated by the pulsed probe light 134 can undergo spontaneous emission to emit photons having the same frequency, phase and direction of travel as the probe light 134. The excited luminescent particle 130 can also emit photons by spontaneous emission which will have the same frequency as photons of the probe light 134. Photons resulting from stimulated emission will be transmitted through the light-guide 132, 232 towards a light collection area 127 where a solar energy collector 128 can be placed. Photons resulting from spontaneous emission are emitted in a random direction, with some fraction of the photons (those with angles of incidence smaller than the critical angle for TIR) escaping out of the solar concentrator 100, 200.

As described with respect to the embodiments of FIGS. 2A and 2B, the absorbed sunlight 116 causes electrons of the luminescent particles 130 to be excited to a luminescent state, therefore the sunlight 116 is referred to as the pump light. A pulsing probe light source 126 emits a probe light 134 in short pulses, at least some of which light is incident on the luminescent particles 130. The probe light 134 is guided within the main body 131, 231 of the solar concentrator 100, 200 via total internal reflection. The duration of each pulse of the probe light 134 is shorter than the time period between pulses. The probe light 134 can stimulate excited electrons of the luminescent particles 130 to decay to the ground state emitting a photon that travels parallel to the direction of the probe light 134 beam. Light is emitted by the excited luminescent particles 130 in pulses that correspond with the pulses of the probe light 134. The intensity of the probe light 134 gradually increases as emitted light (from stimulated emission) is added to the beam, forming an augmented light beam 138, which is an intensified light beam. Furthermore, light emitted upstream (i.e., towards the light source 126) is superimposed on the probe light 134 beam and can stimulate emission downstream (i.e., towards the exit surface 106). As shown in the cross sectional views of FIGS. 2A and 2B, the intensity of the probe light 134 increases inside the solar concentrator 100, 200; the light intensity is lowest near the coupling surface 108 and highest at the exit surface 106. The beam of augmented light 138 exits the light-guide 132, 232 at the exit surface 106 toward the light collection area 127 for harvesting.

The main body 131, 231 of the solar concentrator 100, 200 can be a thin sheet fabricated by spin coating of a polymer and can have an overall thickness in the range of 0.1 to 0.3 mm. A thin solar concentrator 100, 200 is desirable, because it causes the intensity of light output from the solar concentrator 100, 200 to increase, which improves the efficiency of the luminescent system.

Concentrating light in pulses onto a photovoltaic cell (rather than continuously) may be advantageous because it can reduce carrier recombination at the cell level. With reference to the cell, a higher current increases the cell voltage logarithmically, as given by:

$$V \propto \ln(I)$$

Figure 4:
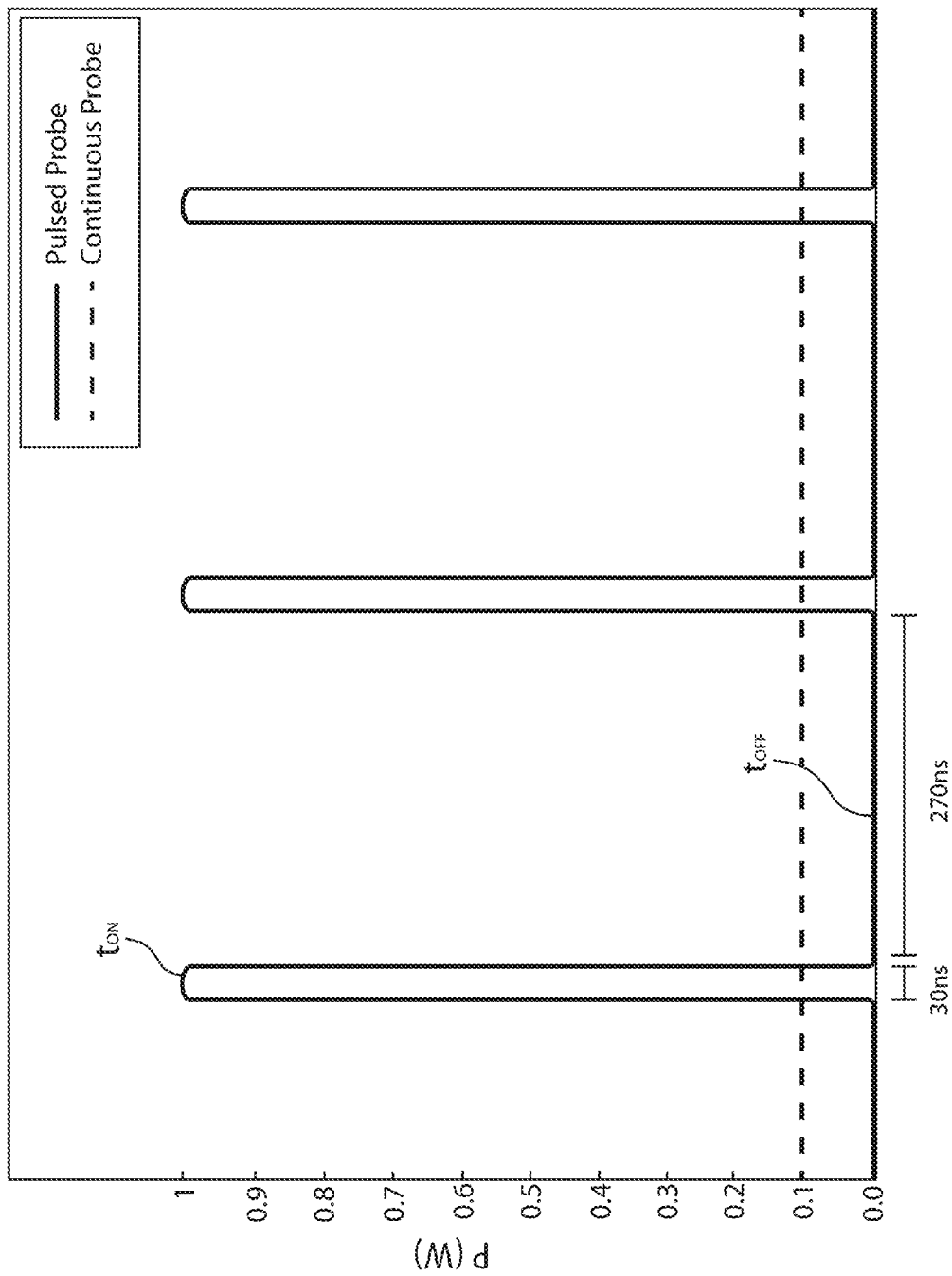
FIG. 4 shows optical power profiles of exemplary continuous and pulsed light sources.

For a single junction cell, the voltage increases by ~60 mV for every decade increase in current. An advantage of the pulsed probe light is that it causes the stimulated emission rate to increase thereby increasing the quantum yield. A factor of 10 increase in intensity, increases the rate of stimulated emission by a factor of 10. FIG. 4 shows the power (P) of a light source as a function of time (t) comparing the time progression of a continuous light source and a pulsed light source. The dotted line shows the time progression of an exemplary continuous probe light source, and the solid line shows the time progression of an exemplary pulsed light source. In this example, a pulsed light source is provided with a 10% duty cycle. The on-time $t_{ON}$ of the pulsed probe having a duration of approximately 30 ns, and the off-time $t_{OFF}$ having a duration of approximately 270 ns. The power of the pulsed probe light is approximately 1 W, while the power of the continuous probe light is approximately 0.1 W. Since the power of the pulsed light-source is higher, so is its intensity. This graph is a non-limiting example of two light sources. It should be understood that light sources of greater of less power, and having different duty cycles may be employed in any of the embodiments described of this application.

A light source 126 that generates a pulsed probe light having the characteristics shown in FIG. 5 can be used in the solar energy concentrator 100, 200. In general, a higher intensity pulsed probe light 134 stimulates emission of photons by excited luminescent particles 130 more efficiently than a lower intensity continuous probe light over an extended period of time due to the reduction of reabsorption at the photovoltaic cell level and the increase in probability that a photon of the probe light 134 will impinge upon an excited luminescent particle 130. Therefore, having a pulsed, high intensity light source can increase the overall efficiency of the solar concentrator 100, 200 without increasing the energy consumed by the light source 126. When a high intensity pulse of light is delivered to a photovoltaic cell, the photovoltaic cell will typically produce a pulse of DC power.

The embodiments described below are generally similar in material and design to the solar concentrator of FIGS. 2A and 2B, and any elements not described in relation to these embodiments can be found in the description above, wherein like reference numerals designate like parts.

Figure 5A:
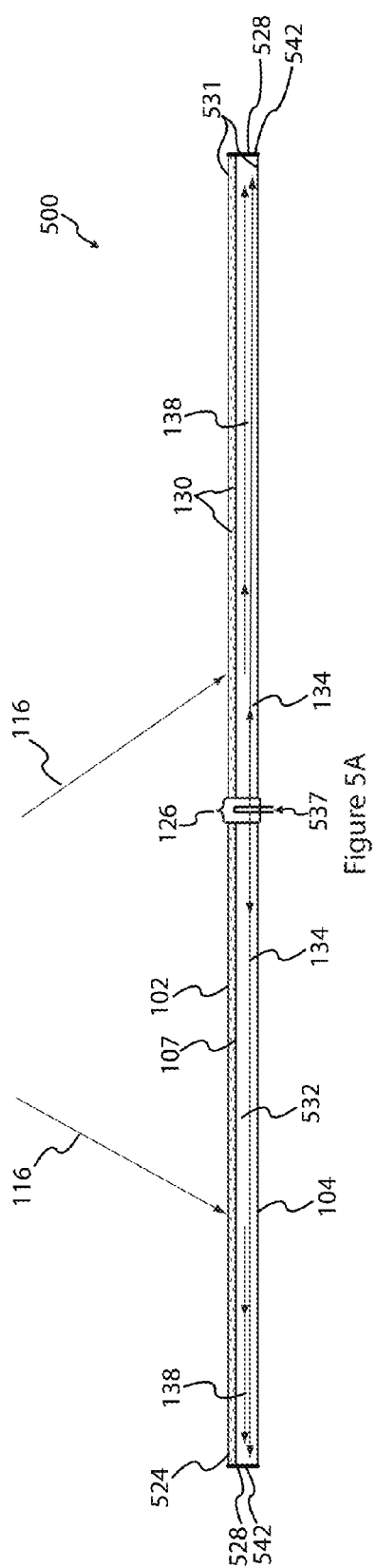
FIG. 5A is a cross sectional view of a circular disk-shaped embodiment of a pulsed stimulated emission luminescent light-guide solar concentrator.
Figure 5C:
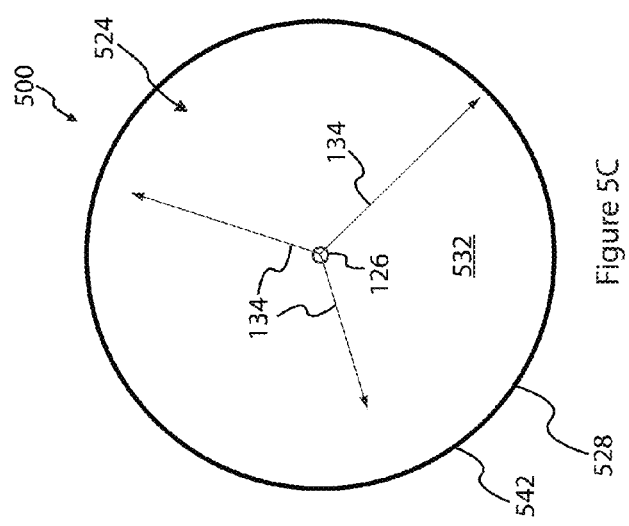
FIG. 5C is a plan view of the circular disk-shaped embodiment of a pulsed stimulated emission luminescent light-guide solar concentrator of FIG. 5A.
Figure 5B:
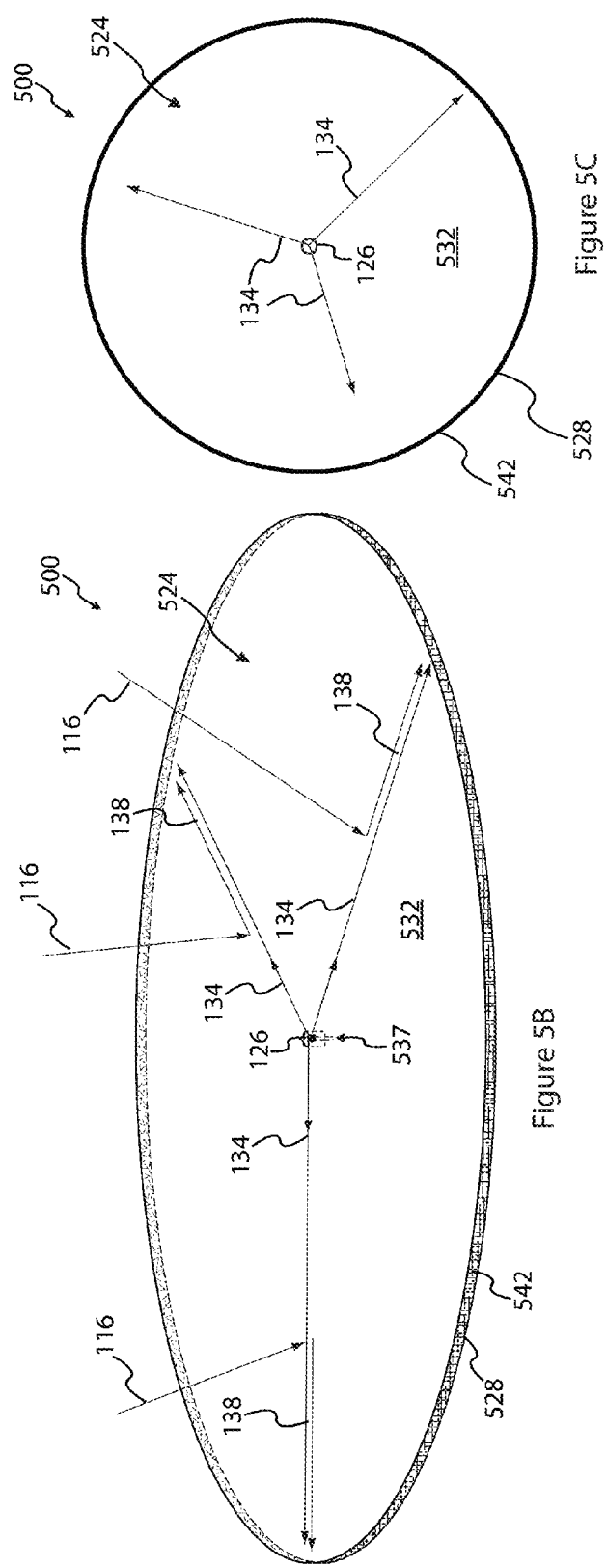
FIG. 5B is a perspective view of the circular disk-shaped embodiment of a pulsed stimulated emission luminescent light-guide solar concentrator of FIG. 5A.

FIGS. 5A-5C show a circular disk-shaped pulsed stimulated emission luminescent light-guide solar concentrator 500. In this embodiment, the pulsed light source 126 can be a point source positioned at the center 537 of the circular disk shaped light-guide 532. Coupled to the first surface 107 of the light-guide 532 there is a thin circular disk-shaped luminescent layer 524. While the solar concentrator 500 shown in FIG. 5A has a luminescent layer similar to that of FIG. 2A, the whole main body 231 can be impregnated with luminescent particles 130 as in FIG. 2B. The solar concentrator 500 is generally planar and thin. The probe light 134 from the pulsed light source 126 is transmitted through the main body 531 of the solar concentrator 500 and stimulates the excited luminescent particles 130 such that they emit photons which add to the augmented light 138. The power of the augmented light 138 therefore increases from the center 537 of the solar concentrator 500 towards its peripheral edge 542 where one or more solar energy collectors 528 can be positioned to harvest the light.

The light rays in FIGS. 5A-5C are only shown as being straight for ease of illustration. As would be understood by one of skill in the art on reading this specification, the light rays would follow the jagged path due to reflections on the light collection surface 102 and the second surface 104 as described above with reference to FIGS. 2A and 2B.

While the light source 126 can be pulsed on and off by any means described above, one way to shutter the light source 126 would be to provide a reflector (not shown), such as a mirror, that continuously rotates around the light source 126 and reflects light generated by the light source 126 to produce a narrow beam of light that sweeps 360 degrees around the light source 126 as the reflector is rotated. The reflector has a curved reflective surface that faces the light source 126. The curved reflective surface may, for example, be a parabolic section with the focal point of the parabola at the light source 126. The area of the solar concentrator 500 not illuminated at a given time by the beam of light is therefore in the shadow of the reflector. The probe light 134 would therefore appear to be pulsed at any given location in the main body 531 of the solar concentrator 500.

Another embodiment of a circular disk-shaped pulsed stimulated emission luminescent light-guide solar concentrator 600 is shown in FIGS. 6A-6C. This embodiment is similar to that of FIGS. 5A-5C except that the peripheral edge 542 has a reflective surface 644 that reflects and refocuses the augmented light 138 back towards a light collection area in the vicinity of the center 537 of the disk, where a solar energy collector 126 can be disposed to harvest the augmented light 146 transmitted thereto. The reflective surface 644 can, for example, be a mirror coating made of metal, such as aluminum or silver, a dielectric or any other suitable material known in the art. The augmented light 146 will have a higher intensity near the center 537 than the probe light 134 initially launched into the main body 531 by the light source 126 due to the addition of emitted light collected along the way (i.e., a cascade effect). Stimulated emission by the probe light 134 occurs as light travels outward towards the peripheral edge 542, and also as the augmented light 146 is refocused and converges towards the center 537 of the disk.

Where at least one solar energy collector 126, such as a photovoltaic cell, is coincident (or nearly coincident) with the light source 126, this device can convert the solar energy converging on the center 537 of the disk into electricity. This electricity would be able to power the light source and would also deliver electric current for use elsewhere. Alternatively, a portion of the concentrated light could be redirected back into the light-guide 532 with an optical element such as an optical fiber and used as the probe light source. If the pump light source (sunlight in this embodiment) is removed from the system, then the solar concentrator 600 ceases to function immediately and the device will cease to operate until sunlight or another pump light source is applied.

An LED or laser, is almost identical to a PV cell, having the same overall structure of materials, therefore, in one embodiment the same device can be used to collect and emit probe light. An electrical pulse can be sent to the semiconductor device creating light. When the pulse of light is emitted into the solar concentrator 600, the current would be stopped while the light propagates through the solar concentrator 600. When the light converges onto the semiconductor device, it becomes electrical current. This embodiment requires actively switching the connections on the semiconductor from a power source, to a load.

Figure 6D:
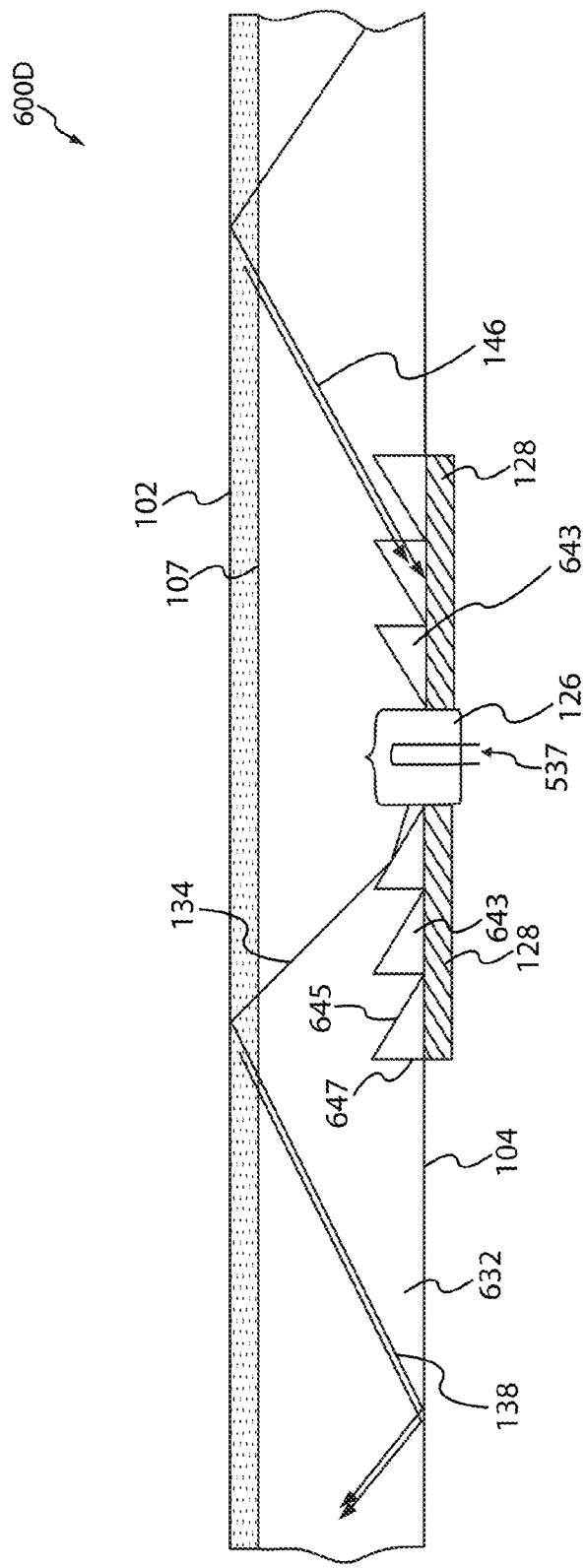
FIG. 6D shows a portion of a cross section of another embodiment of another embodiment of a circular disk-shaped pulsed stimulated emission luminescent light-guide solar concentrator.

A portion of a cross-section of a circular disk-shaped pulsed stimulated emission luminescent light-guide solar concentrator 600D is shown in FIG. 6D. This embodiment is generally similar to that of FIGS. 6A-6C, however the light-guide 632 may be injection molded, embossed or machined in such a way that it contains annular triangular gaps 643 at the center of the disk where the light source 126 and the solar energy collector 128 are located. The annular triangular gaps 643 are concavities formed at the bottom surface 104 of the light guide, and each annular triangular gap 643 includes one reflective surface 645 for reflecting light from the light source 126 into the main body 531 of the solar concentrator 600D, and one output surface 647 for accepting reflected and augmented light 146, such that it is transmitted to the solar energy collector 128.

Figures 7A, 7B:
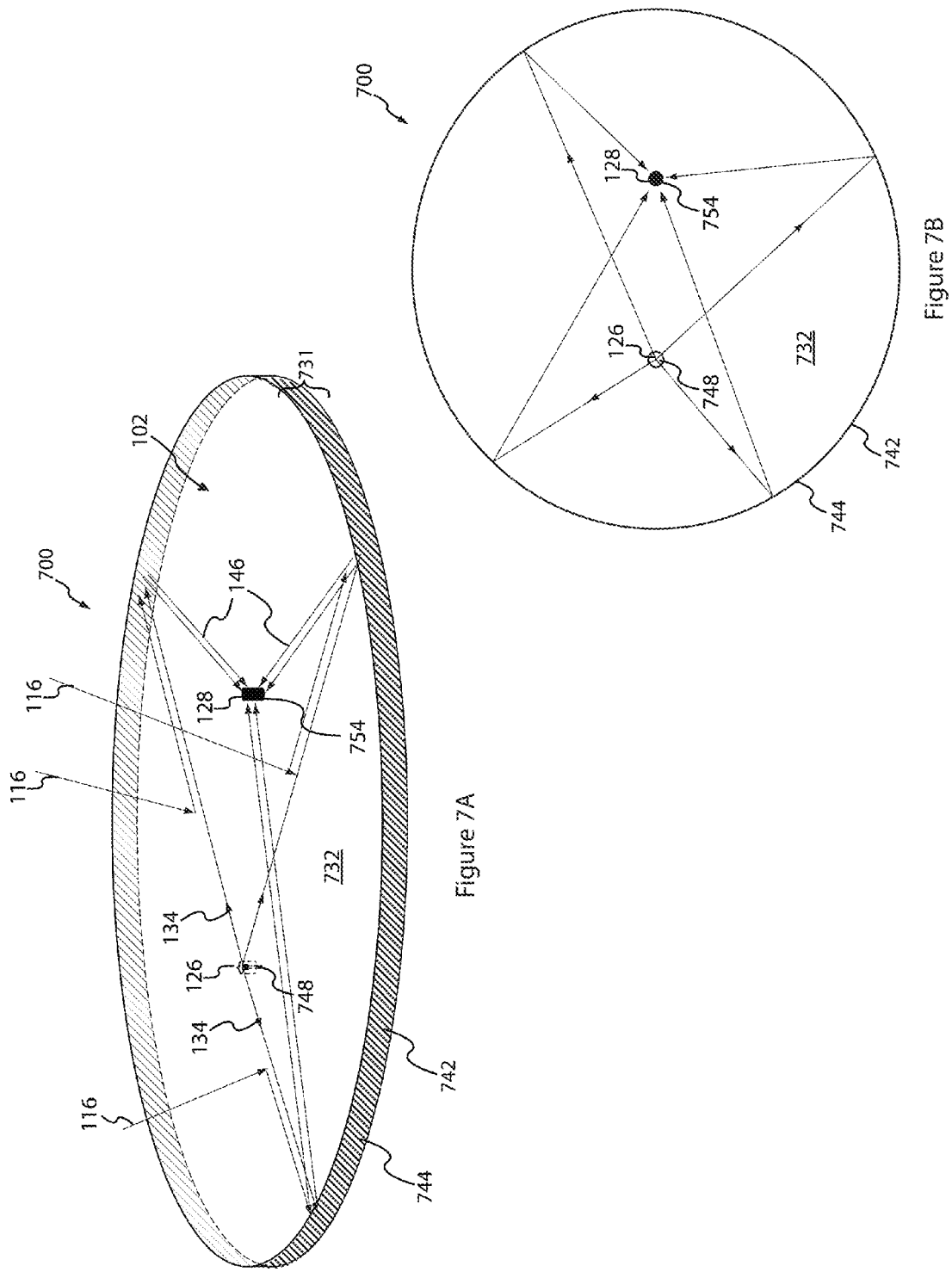
FIG. 7A is a perspective view of an embodiment of an elliptical disk-shaped pulsed stimulated emission luminescent light-guide solar concentrator.
FIG. 7B is a plan view of the elliptical disk-shaped pulsed stimulated emission luminescent light-guide solar concentrator of FIG. 7A.

A pulsed stimulated emission luminescent light-guide solar concentrator 700 having the shape of an elliptical disk with two foci is shown in FIGS. 7A and 7B. In this embodiment the pulsed probe light source 126 is positioned at a first focal point 748 and the solar energy collector 128 is positioned at a second focus 754 of an elliptical disk-shaped light-guide 732. The light-guide 732 can contain luminescent particles within its main body 731, as in FIG. 2B, or there may be a luminescent layer (not shown) optically coupled to the first surface 107 of the light guide 732, as in FIG. 2A. The peripheral edge 742 of the light-guide 732 has a reflective surface 744 as in the embodiment of FIGS. 6A-6C. The probe light 134 spreads out from the first focal point 748, is reflected by the reflective surface 744 and converges to the second focal point 754 where a solar energy collector 128 can be placed. The probe light 134 stimulates emission as it is transmitted towards the peripheral reflective edge, and as it converges towards the second focal point 754. Therefore, the pulses of light 146 have highest intensity at the light collection area and can deliver more power thereto than was used to power the pulsed light source 126. The pulsed light source 126 and the solar energy collector 128 can be placed on a single circuit board for convenience if they are relatively close together. (The ellipse can be altered to increase or decrease the spacing distance between the light source 126 and the solar energy collector 128.)

A pulsed stimulated emission luminescent light-guide solar concentrator 800 having the shape of half an elliptical disk is shown in FIGS. 8A and 8B. This embodiment is very similar to the solar concentrator 700 described above and shown in FIGS. 7A and 7B, except that this embodiment only employs half an elliptical disk and as such the light-guide 832 has a planar edge 858 along which the two foci 748, 754 of the ellipse are located. The light source 126 is optically coupled to the planar edge 858 at the first focal point 748 and a solar energy collector 128 can be positioned at the light collection area located at the second focal point 754. The solar concentrator 800 also has a semi-elliptical peripheral edge 842 with a reflective surface 844 similar to the reflective surface 744 of the elliptical solar concentrator 700. The light source 126 and solar energy collector 128 may be located on a single circuit board 859 edge mounted to the planar edge 858. In some applications, edge mounting the circuit board 859 may be more convenient than mounting it at or near the center of the light-guide 732 as in the embodiments shown in FIGS. 7A and 7B. In the present embodiment, the light-guide 832 can contain luminescent particles within its main body 831, as in FIG. 2B, or there may be a luminescent layer (not shown) optically coupled to its first surface, as in FIG. 2A. A portion of the concentrated light collected in the light collection area at the second focal point 754 could be redirected back into the light-guide 732 through the first focal point 748 with an optical element such as an optical fiber 839 and used as the probe light source.

A pulsed stimulated emission luminescent light-guide solar concentrator 900 having the shape of a section of an elliptical disk (herein referred to as "pie-shaped"), is shown in FIGS. 9A and 9B. This embodiment is another variant of the solar concentrator 700 of FIGS. 7A and 7B and is quite similar to the solar concentrator 800 of FIGS. 8A and 8B. The solar concentrator 900 has a main body 931 having a shape less than half an ellipse. In the embodiment illustrated in FIGS. 9A and 9B, the ellipse is nearly circular such that the two foci 748, 754 are close together and the light source 126 and the solar energy collector 128 can be mounted on a single circuit board more easily and reduce the dead space between the light source 126 and the light collection area. This pie-shaped design can be useful for tiling a plurality of solar concentrators 900, as described below with respect to FIGS. 23A and 23B.

In any of the above elliptical or partial elliptical embodiments, instead of having a single pulsed probe light source 126 positioned at the first focal point 748, there can be two or more pulsed probe light sources 126 in the vicinity of the first focal point 748, and an equal number of solar energy collectors 128 in the vicinity of the second focal point 754, where the light from each pulsing probe light source is focused onto each solar energy collector.

Alternatively, each of the focal points 748, 754 can have both a pulsed light source 126 and a solar energy collector 128 located in its vicinity. Pulsed probe light 134 emitted by the light source 126 at the first focal point 748 is augmented and convergent upon the solar energy collector at the second focal point 754. Similarly, Pulsed probe light 134 emitted by the light source 126 at the second focal point 754 is augmented and convergent upon the solar energy collector at the first focal point 748. The light sources can have the same or different wavelengths to excite one or more types of luminescent particles respectively.

Additionally, in embodiments where there are two or more pulsed probe light sources 126, the light sources 126 can alternate or otherwise be pulsed "on" at different times to produce a series of augmented light pulses converging to the solar energy collector at different times.

The period between the probe light pulses can be controlled using a feedback system, particularly in embodiments where the light source 126 and the solar energy collector 128 are mounted on a single circuit board. Such a feedback system can measure and take into account the power arriving at the solar energy collector 128.

A pulsed stimulated emission luminescent light-guide solar concentrator 1000A that is pie-like in shape is shown in FIG. 10A. This embodiment is the same as the embodiment of FIGS. 9A-9B except that in this embodiment, the peripheral edge 1074 comprises a plurality of reflecting facets 1070. The reflecting facets 1070 are curved and the curve can be, for example, portions of an ellipse, a circle, a parabola, or a non-analytical curve. Five elliptically curved reflecting facets 1070 sharing two common foci 748, 754 are shown in FIG. 10A; however this is shown merely for illustrative purposes, and the number of reflecting facets 1070 may be increased or decreased in other embodiments. If the peripheral edge 1074 comprises many small reflecting facets 1074, the peripheral edge 1074 can be substantially planar; the smaller the facets 1070, the more planar the peripheral edge 1074 can be made, as shown in FIG. 10B. As in the embodiments of FIGS. 8A, 8B, 9A and 9B, the light-guide 1032 of solar concentrator 1000A has a planar edge 958 along which the two foci 748, 754 of an ellipse are located. The pulsed light source 126 is optically coupled to the planar edge 958 at the first focal point 748 and a solar energy collector 128 can be positioned at the second focal point 754. Pulsed probe light 134 is emitted by the light source 126 and propagates towards the peripheral edge 1074 where it is reflected and redirected towards the second focal point 754 by the reflective facets 1070. The reflective facets 1070 can have a mirror coating like that of the reflective surface 744. The advantage of the design in FIG. 10B is that is allows for very close packing, as shown in FIG. 10C.

Figure 10D:
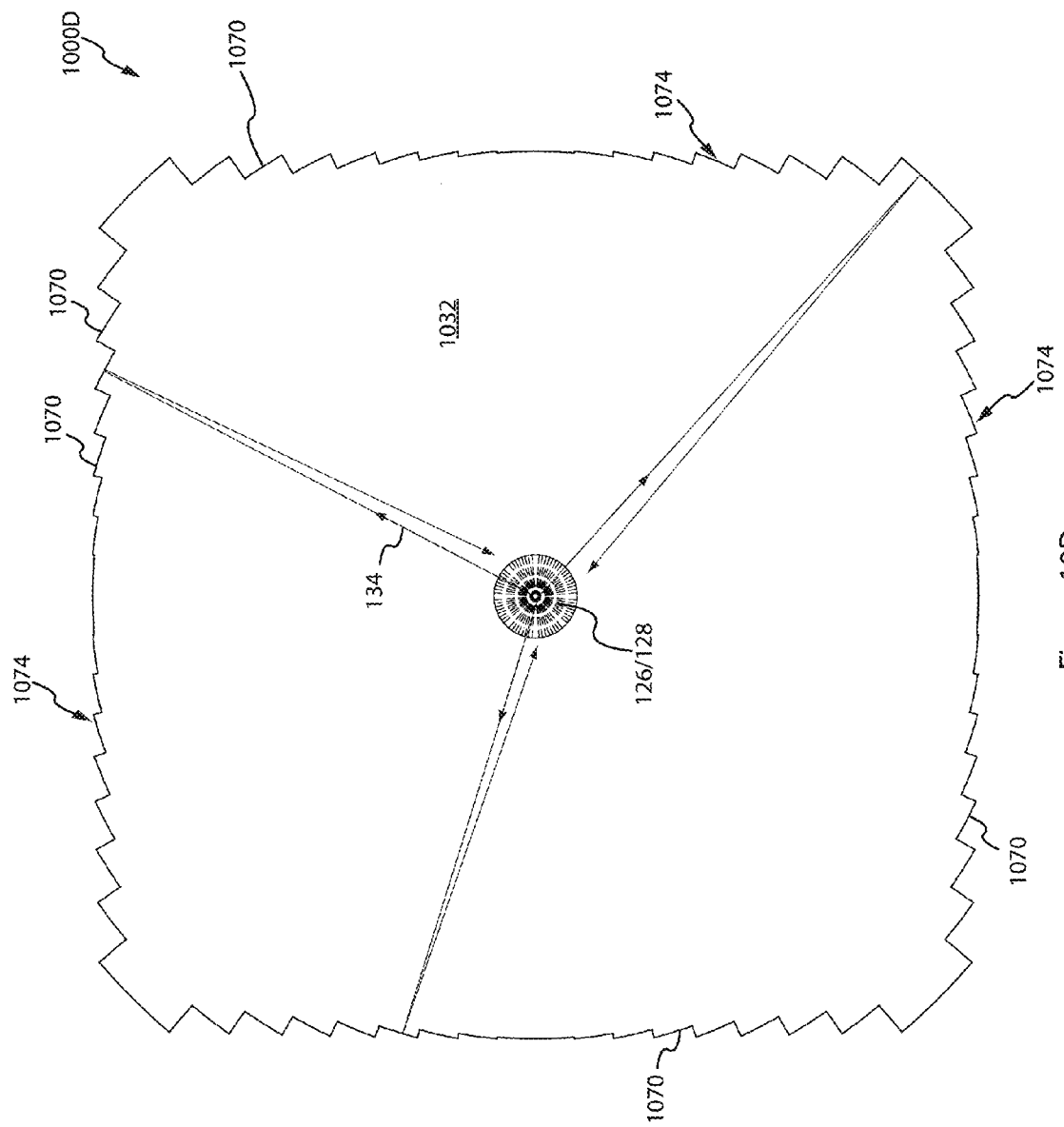
FIG. 10D is a plan view of an embodiment of a square disk-shaped pulsed stimulated emission luminescent light-guide solar concentrator.

A pulsed stimulated emission luminescent light-guide solar concentrator 1000D in the shape of a square disk is shown in FIG. 10D. In this embodiment, the peripheral edges 1074 of the light-guide 1033 have a plurality of reflective facets 1070. As described above, the reflective facets 1070 are curved and the curve can be, for example, portions of a curve, such as an ellipse, a circle, a parabola, or a non-analytical curve. An advantage of using portions of curves rather than an entirely curved peripheral reflective edge to refocus the light, is that the solar concentrator can be made into a shape that is easier to stack or tile, for example, a square as shown in FIG. 10D. In the embodiment of FIG. 10D, each of the reflective facets 1070 reflects light from the pulsed light source 126 near the center of the disk back towards a light collection area also near the center of the disk, where a solar energy collector 128 can be placed. The reflected augmented rays 146 are shown at a slight angle for clarity, but in fact the reflected augmented rays 146 would overlap the probe light 134 coming from the pulsed light source 126 at the center of the sphere. The idea of breaking up a smooth curved reflective surface 644, 744, 844, 944 into a series of small curved reflective facets 1070 to form a substantially flat peripheral edge can apply to any of the embodiments described herein.

It is possible to devise systems where the main body absorbs incoming sunlight 116, but is not exposed to excessive concentration. All of the embodiments described above absorb incident light 116 and concentrate light 134, 138, 146 within the main body 131, 231, 531, 731, 831, 931 of the solar concentrator. FIGS. 11A and 11B show a bi-layer pulsed stimulated emission luminescent light-guide solar concentrator 1100, having the shape of a circular disk. The bi-layer solar concentrator 1100 includes a luminescent sheet 1111 (similar to the main body 531 of the solar concentrator 500 of FIGS. 5A-5C) and a secondary light-guide 1184 adjacent to the luminescent sheet 1111.

The luminescent sheet 1111 has a disk-shaped primary light-guide 1132 and a thin disk-shaped luminescent layer 124. As in the embodiments of FIGS. 2A, 5A, 6A, the primary light-guide 1132 has a first surface 1107 and a second reflective surface 1104. The luminescent layer 124 is optically coupled to the first surface 1107 of the primary light-guide layer 1132. Alternatively, the luminescent sheet 1111 can comprise a primary light-guide layer 1132 that has luminescent particles impregnated within its main body, as in FIG. 2B. In the embodiment illustrated in FIG. 11A, the luminescent layer 124 has a circular or annular light collection surface 1102. Sunlight 116 incident on the light collection surface 1102 enters the luminescent sheet 1111 and is absorbed, at least in part, by the luminescent particles 130 in the luminescent sheet 1111. The secondary light-guide 1184 has a first reflective surface 1151 and a second reflective surface 1153.

The bi-layer solar concentrator 1100 has a reflective surface 1144 on its peripheral edge 1142. The reflective surface 1144 can, for example, be a mirror coating made of metal, such as aluminum or silver, a dielectric or any other suitable material known in the art. Incident sunlight 116 enters the luminescent sheet 1111 via the light collection surface 1102 and excites luminescent particles 130 contained in the luminescent sheet 1111. The pulsed probe light 126, positioned at the center of the primary luminescent solar concentrator 1111, simulates the excited luminescent particles 130 such that they emit photons having a frequency or frequencies within the emission spectrum or spectra of the luminescent particles. The emitted photons travel in phase with the probe light 134 towards the peripheral edge of 1142, where it is reflected by the reflective surface 1144.

The secondary light-guide 1184 is optically coupled to the primary luminescent solar concentrator 1111 along the peripheral edge 1142. At least the upper portion of the reflective surface 1144, adjacent to the luminescent sheet 1111 is disposed at an oblique angle to the plane of the luminescent sheet 1111 and the secondary light-guide 1184 such that the light 146 augmented in the luminescent sheet 1111 is reflected by the reflective surface 1144 into the secondary light-guide 1184. The augmented light 146 propagates in the secondary light-guide 1184 towards the exit surfaces or surfaces 1106 of the secondary light-guide 1184. The bi-layer solar concentrator 1100 illustrated in FIGS. 11A and 11B has four intersecting exit surfaces 1106 which form a square recess 1188 at the center 1137 of the bi-layer solar concentrator 1100. Four solar energy collectors 1186 can be optically coupled to the exit surfaces 1106 of the secondary light-guide 1184 to harvest the solar energy.

Light is guided within the luminescent sheet 1111 via TIR on the light collection surface 1102 and the second reflective surface 1104, and within the secondary light-guide 1184 via TIR on the first surface 1151 and the second surface 1153. A gap 1190 filled with a material of lower refractive index than the light-transmissive material(s) of the luminescent sheet 1111 and the secondary light-guide 1184 is provided to facilitate TIR on the second reflective surface 1104 of the luminescent sheet 1111 and the first reflective surface 1151 of the secondary light-guide 1184. The gap can be filled by air, silicone or any other suitable optical encapsulant, bonding or cladding material. This gap 1190 does not extend all the way to the peripheral reflective edge 1142 in order to allow the augmented light 146 guided by the luminescent sheet 1111 to be optically coupled into the secondary light-guide 1184.

Figure 11D:
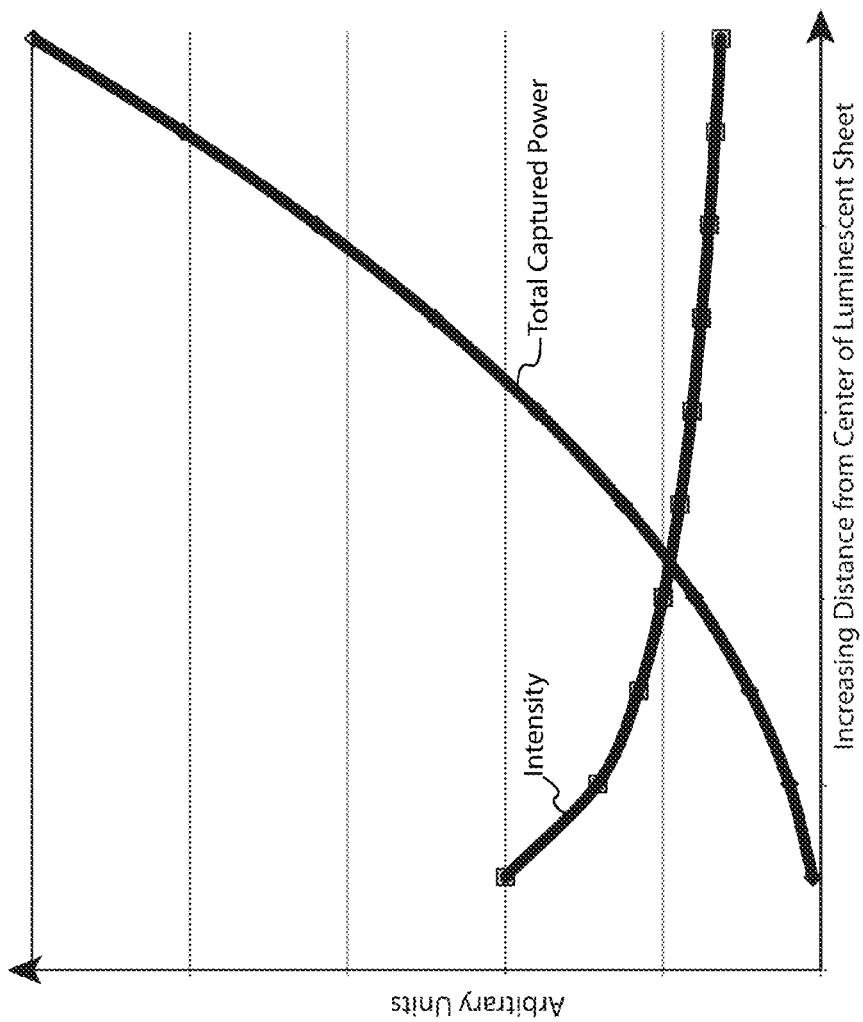
FIG. 11D is an illustrative graph of captured power and intensity of an outward moving wavefront of the bi-layer pulsed stimulated emission luminescent light-guide solar concentrator of FIG. 11A.
Figure 11C:
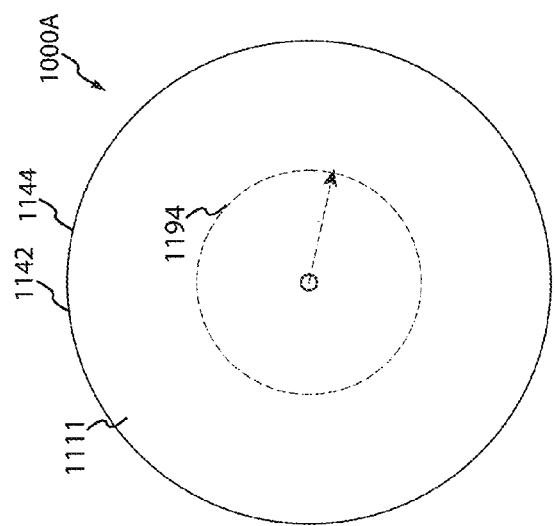
FIG. 11C is a plan view of the bi-layer pulsed stimulated emission luminescent light-guide solar concentrator of FIG. 11A showing an outward moving wavefront.
Figure 11F:
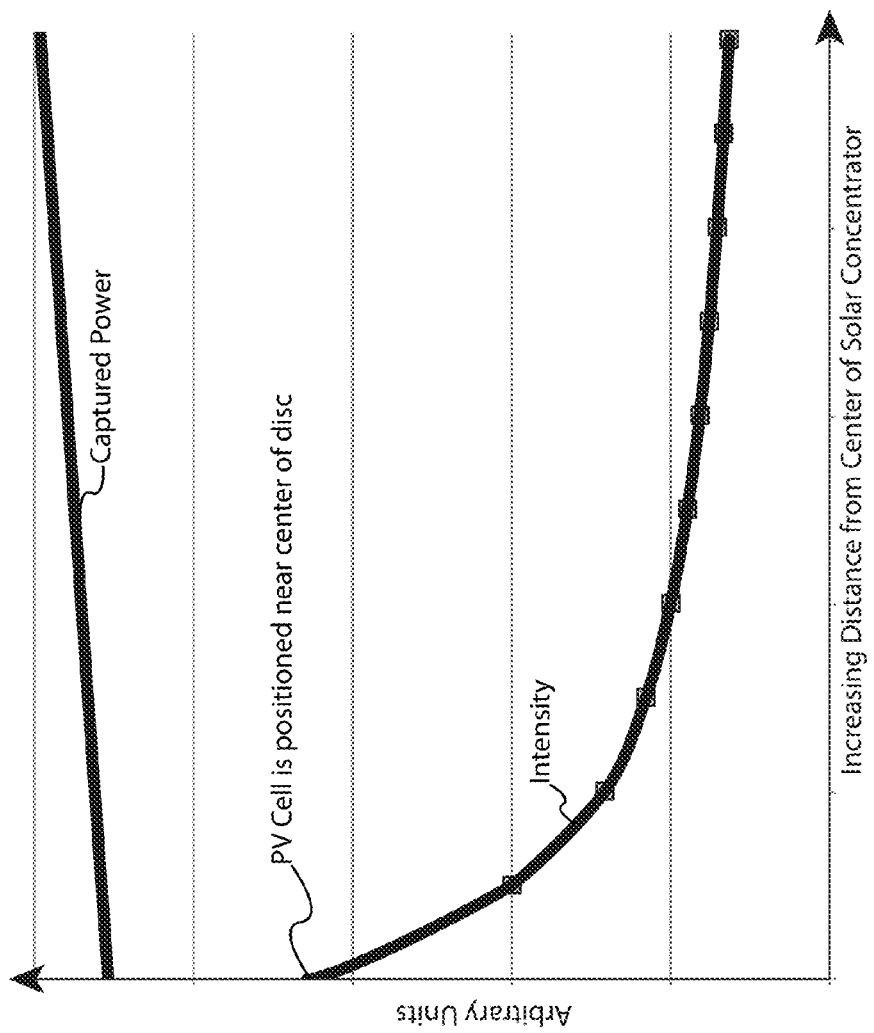
FIG. 11F is an illustrative graph of captured power and intensity of an inward moving wavefront of the bi-layer pulsed stimulated emission luminescent light-guide solar concentrator of FIG. 11A.
Figure 11E:
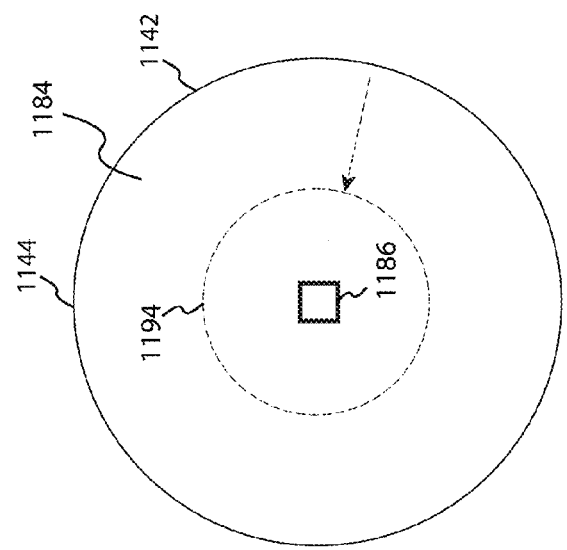
FIG. 11E is a plan view of the bi-layer pulsed stimulated emission luminescent light-guide solar concentrator of FIG. 11A showing an inward moving wavefront.

Referring to FIG. 11C, a wavefront of light 1194 is shown expanding outwards through the luminescent sheet 1111. The graph in FIG. 11D shows the captured power and the intensity as the wavefront moves out from the center towards the peripheral edge 1142 of the solar concentrator 1100. The captured power increases as the wavefront 1194 of light expands over the whole disk. The intensity is shown to drop slightly over the same distance. Depending on the particular luminescent dye and the amount of available sunlight, the intensity can drop, increase, or stay constant. FIG. 11E shows the same wavefront 1194, having been reflected by the reflective surface 1144 on the peripheral edge 1142 of the solar concentrator 1100, converging in the secondary light-guide 1184 towards the light collection area at the center of the disk where the solar energy collectors 1186 are located. The graph in FIG. 11F shows the captured power and the intensity as the wavefront moves inward towards the exit surfaces 1106 of the secondary light-guide 1184. The captured power drops off slightly as the light converges towards the center of the disk. This is due to scattering mechanisms and absorption in the bulk. No new sunlight is being captured in the secondary light-guide 1184. The intensity on the other hand increases dramatically as light converges towards the center of the disk. In the embodiment shown in FIGS. 11A and 11B, the solar energy collectors 1186 are positioned at a point of high intensity, where the light is very concentrated.

One advantage of using bi-layer stimulated emission luminescent solar concentrators is that the highest concentration only occurs in the secondary light-guide 1184, away from the luminescent dye. The secondary light-guide 1184 can be made of a resilient light-transmissive material such as glass, and the concentrations achievable could be in the range of 1000-3000 suns, although, theoretically in ideal conditions, concentrations up to 10000 suns could be achieved. Such super high concentrations might damage dyes, but using a bi-layer design prevents the dye from experiencing the high flux associated with high concentration.

While the bi-layer solar concentrator 1100 described with reference to FIGS. 11A-11F was circular disk-shaped, bi-layer solar concentrators can be elliptical, pie-shaped or any other suitable shape.

The arrangement and means of coupling light between the luminescent sheet 1111 and the secondary light-guide 1184 and means of coupling light between the secondary-light guide 1184 and a solar energy collector 128 of bi-layer pulsed stimulated emission luminescent light-guide solar concentrators is the subject of FIGS. 12A-15B. The embodiments described below (FIGS. 12A through 15B) show cross sectional views of circular disk-shaped solar concentrators, but the concepts are equally applicable to any of the above described shapes.

The bi-layer solar concentrator 1200 of FIG. 12A is generally similar to the bi-layer solar concentrator 1100 of FIGS. 11A-11F. In this embodiment, the luminescent sheet 1111 and the secondary light-guide 1184 are joined by a semi-circular optic 1295. The exit surface 1297 of the luminescent sheet 1111 and the input surface 1287 of the secondary light-guide 1184 are optically coupled to the semi-circular optic 1295. An external reflector 1296 is placed over (i.e., covers the peripherally exposed surface of) the semi-circular optic 1295, although the peripheral surface of the semi-circular optic 1295 could alternatively be coated with a reflective material. Augmented light 146 (which includes photons from the light source 126 and photons from stimulated emission) is transmitted through the luminescent sheet 1111, and is emitted from the exit surface 1297, such that it is transmitted into the semi-circular optic 1295, as shown in FIG. 12B. Some of the augmented light 146 is redirected within the semi-circular optic 1295 via total internal reflection (such as at 1298). Some light exits the semi-circle optic 1295 and is reflected by the external reflector 1296 (such as at 1229). In this manner the augmented light 146 is redirected into the secondary light-guide 1184, where it is transmitted via TIR and converges towards the light collection area at or near the center of the disk.

In this embodiment, the secondary light-guide 1211 has an output surface 1217 that is annular. The bi-layer solar concentrator 1200 therefore has a circular recess at its center, bounded by the luminescent sheet 1111 and the output surface 1217 of the secondary light-guide 1211, and continuous with the gap 1290. A secondary optical element 1211 is positioned within the circular recess, a detailed view of which is shown in FIG. 12C. The secondary optical element 1211 has an annular input surface 1213 which is optically coupled to the annular output surface 1217 of the secondary light-guide 1184. The secondary optical element guides the augmented light 146 received through the annular input surface 1213 toward a light collection area where a solar energy collector 128 can be placed to harvest the solar energy.

The secondary optical element has a curved surface 1215, which redirects the augmented light 146 towards the light collection area where a solar energy collector 128 can be placed. The curved surface can redirect the light 146 via total internal reflection, or by means of a curved mirror insert 1219. The curved mirror insert has at least one reflective surface 1230 that has the same curvature as the curved surface 1215 of the secondary optical element 1211. Alternatively, the secondary optical element 1211 can have a mirror coating on its curved surface 1215.

In the solar concentrator module shown in FIG. 12A, the solar energy collector 128 lays substantially parallel to the light collection surface 102 of the solar energy collector 1200. The solar energy collector 128, which can be a photovoltaic cell, can be mounted on a circuit board 1221 and is optically coupled to the exit surface 1223 of the secondary optical element 1211 by means of optical bonding agent 1225. A reflective coating 1227 can be applied to the surface of the circuit board 1221 in order to prevent losses due to absorption by elements other than the solar energy collector 128. A bypass diode 1229, typical of concentrator cells, is shown attached to the backside of the circuit board 1221.

FIGS. 13A-13C shows the same bi-layer solar concentrator module as FIGS. 12A-12C, only in an inverted orientation, such that sunlight 116 enters the solar concentrator 1200 through the second surface 1153 of the secondary light-guide 1184. Because the bi-layer solar concentrator 1200 is substantially a disk of light-transmissive material such as glass with a light collecting system at its center, light passes through the solar concentrator 1200 largely undisturbed and can be concentrated onto the solar energy collector 128 as described with reference to FIGS. 12A-12C. This embodiment allows for the solar energy collector 128 and the light source 126 to be mounted on the same circuit board. Antireflection coatings can be applied to the second surface 1104 of the luminescent sheet 1111 and to the first reflective surface 1151 of the light-guide 1184 to reduce Fresnel losses at those interfaces. The solar concentrators described herein and above are bi-facial, i.e., they can be made to function in either orientation.

FIGS. 14A-14C shows the same solar concentrator module as FIG. 12A-12C, except that the secondary optical element 1121 is in an inverted position such that the solar energy collector 128 is disposed in the gap 1190. The solar energy collector 128 and light source 126 can therefore both be mounted on the same circuit board 1441.

The bi-layer pulsed stimulated emission luminescent light-guide solar concentrator 1500, shown in FIGS. 15A and 15B, is similar to the bi-layer solar concentrator 1300 of FIGS. 13A-13C, but has an inverted orientation such that incoming sunlight 116 enters the system through the second surface 1153 of the secondary light-guide 1148. In this embodiment, the luminescent sheet 1111 is very thin compared to the secondary light-guide layer 1148. A thin luminescent sheet can have two advantages: (1) a relatively high flux can be maintained in the luminescent sheet 1111 to keep the probability of stimulated emission high; and (2) the need for the external reflector 1296 can be eliminated. Light entering the semi-circular optic 1295 will TIR and couple into the secondary light-guide 1184.

As array of pulsed stimulated emission luminescent light-guide solar concentrators can be interconnected to form a stimulated emission solar concentration assembly 1600 as shown in FIGS. 16A-16C. Any of the embodiments of a solar concentrator of the present invention may be employed in this manner, though some shapes are more tileable than others.

The solar concentration assembly 1600 can be arranged such that the solar concentrators 1601 are spaced apart from each other, as shown in FIGS. 16A and 16B. In this embodiment a scattering reflector sheet 1661 is placed bellow the array of solar concentrators 1601, such that any incoming light 218 that misses or passes through the solar concentrators 1601 can be scattered and reflected by the scattering reflector sheet 1661 and potentially absorbed by one of the solar concentrators 1601. The bifacial nature of the solar concentrators 1601 (which may be any of the solar concentrators described above) can therefore be used to achieve higher concentration with fewer optical components.

In a similar embodiment, the solar concentration assembly can be made from an array of square, pie or pie-like shaped solar concentrators, such as those described in FIGS. 9A-10D. An advantage of these shapes is that they are tileable such that compact solar concentration assemblies can be made.

A stimulated emission solar concentration assembly 1700 with a central pulsed light source 1755 is shown in FIG. 17A. This embodiment is generally similar to that of FIGS. 16A-16C. The central pulsed light source 1755 can be used to generate a probe light 134 for a plurality of solar concentrators 1701 of the solar concentration assembly 1700. The light source 1755 feeds light into optical fibers 1757 that deliver the light to the plurality of solar concentrators 1701 of the solar concentration assembly 1700. FIG. 17B shows how the end 1759 of the optical fiber 1757 can be structured with an inverted triangle shape which can serve as a side emitter. Light delivered by an optical fiber can be used in the exact same way as light from a diode, and has the advantage of requiring only one, central light source rather than several, which may reduce costs and be less prone to failure.

A finite element model was created to model the collection of energy in a stimulated emission luminescent light-guide solar concentrator in the shape of a circular disk. A dye system is modeled using a phosphorescent dye Pt-(TPBP) (a platinum-porphyrin derivative), with absorption maxima at 430 nm and 615 nm, and an emission peak at 772 nm. The circular solar concentrator is divided into a series of annular rings, with a radial light source introduced at the center to act as the probe. A sheet thickness of 100 mm is used to maintain a high probe light intensity. In each ring the absorbed solar power is determined along with the probability of stimulated emission and reabsorption.

$$P_n = P_{n-1} + P_{solar,n} p_{stim} - P_{abs,n}$$

$P_n$—power in ring n
$P_{solar,n}$—absorbed solar power in ring n
$p_{stim}$—probability of stimulated emission
$P_{abs,n}$—power lost to reabsorption in ring n This first-order model gives a lower bound to the power that can be extracted from the luminescent solar concentrator as it overestimates losses. The model considers photons that are absorbed by the dye to be irretrievably lost, while reabsorption actually leads to an excited dye molecule that once again relaxes via spontaneous or stimulated emission. There also exists an overestimate of lost energy to spontaneous emission, which occurs with probability $1-p_{stim}$. Spontaneously emitted photons that are emitted at large angles relative to the solar concentrator are lost from the system, however those photons that remain in the solar concentrator will eventually be reabsorbed, whereupon there is again a chance to undergo stimulated emission.

Figure 18B:
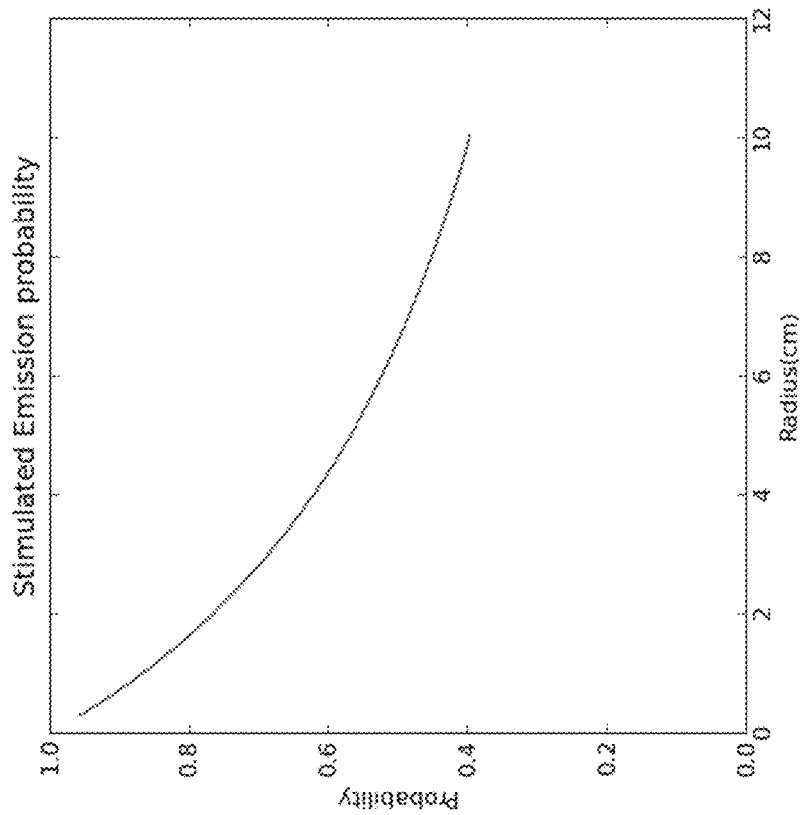
FIG. 18B is an illustrative graph of the probability of stimulated emission as a function of radius.
Figure 18A:
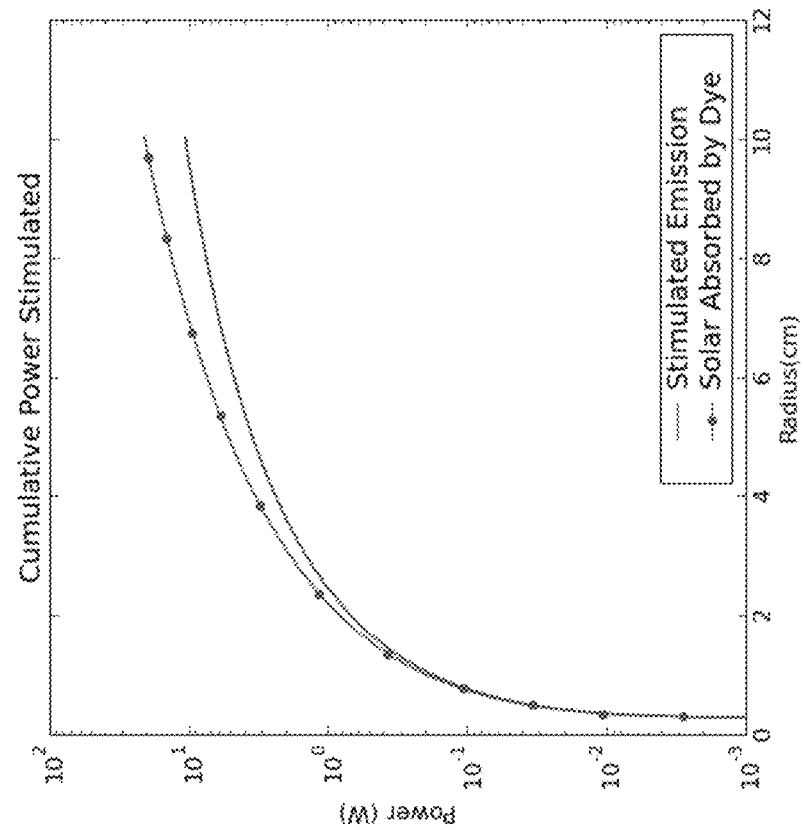
FIG. 18A is an illustrative graph of absorbed solar power and power of stimulated emission as a function of radius.

FIG. 18A shows the cumulative absorbed solar power and power stimulated in the probe mode as a function of the radial distance, moving from the inner radius of 3.0 mm, out to the edge of the disk at 10 cm. FIG. 18B shows the probability of stimulated emission as a function of the radial distance with an initial probe intensity of 530 kW/cm2. The probability of stimulated emission falls with increasing distance from the center as the area illuminated by the probe light (from original probe and stimulated emission) increases with radius.

Different dies and geometries can be used in order to reduce the requirements for initial probe intensity power and to improve the sunlight absorption efficiency. However, the first order models demonstrate that it is possible to achieve a net gain in power by capturing sunlight in this way.

Figure 19:
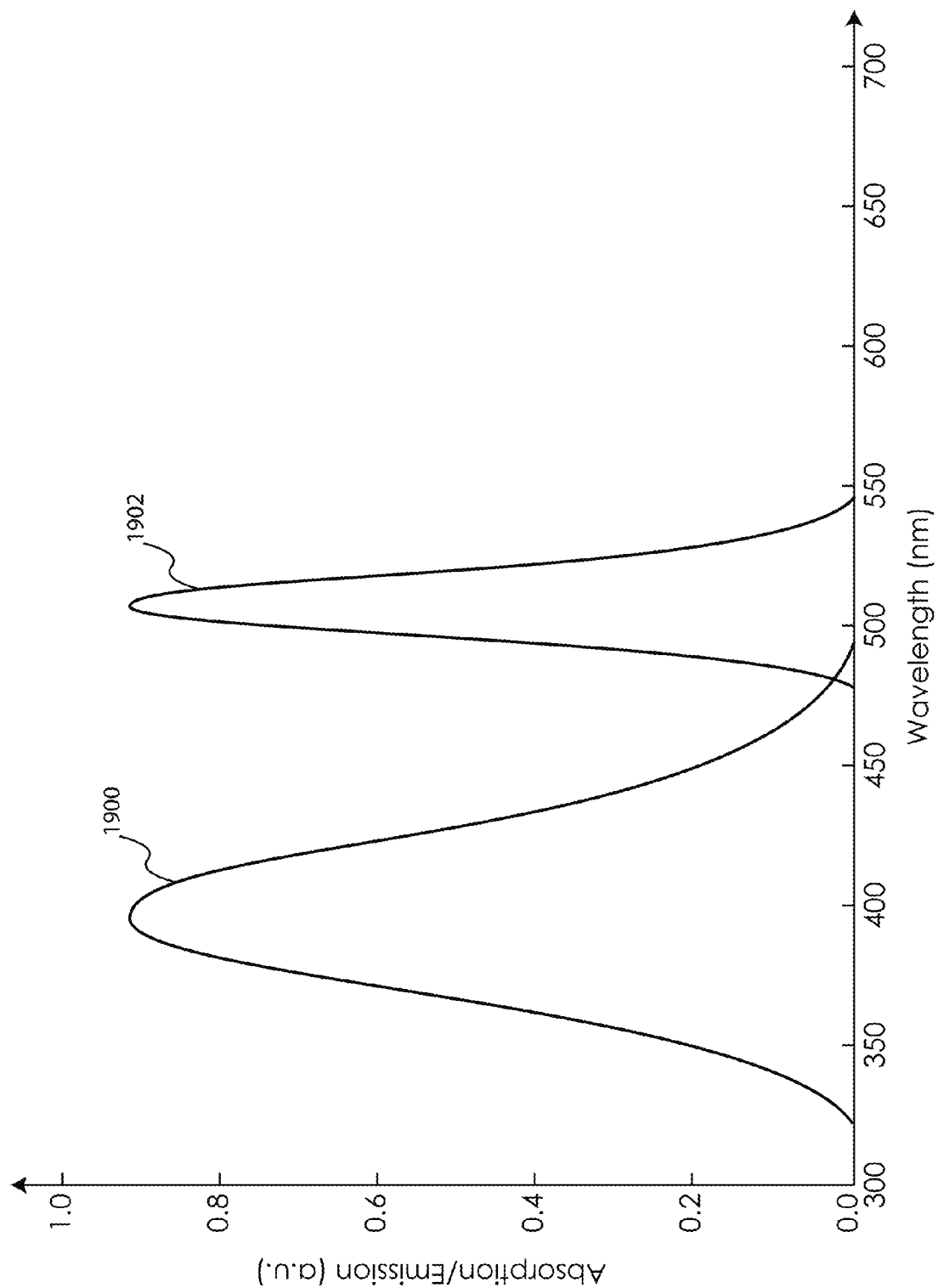
FIG. 19 is an illustrative graph of absorption and emission spectra of a single luminescent material.

Higher efficiency can be gained for stimulated emission luminescent light guide solar concentrators if multiple luminescent materials are used, each of which reacts to a different portion of the solar spectrum. For example, FIG. 19 shows a single luminescent material with an absorption spectrum 1900 and an emission spectrum 1902. FIG. 20 shows three distinct sets of absorption spectra 2000, 2004, 2008 and corresponding emission spectra 2002, 2006, 2010, (each denoted by a different line style), representing the luminescence characteristics of three different luminescent materials. A first luminescent material has the absorption spectrum 2000 and emission spectrum 2002, a second luminescent material has the absorption spectrum 2004 and emission spectrum 2006, and a third luminescent material has the absorption spectrum 2008 and emission spectrum 2010. The first luminescent material has a peak absorption at approximately 375 nm, the second material has a peak absorption at approximately 475 nanometers and the third material has a peak absorption at approximately 575 nanometers. These wavelengths and absorption emission curves are used for illustrative purposes and are meant to be non-limiting. In fact, any number of luminescent materials or dyes could be employed with absorption and emission spectra in the ultraviolet band, the visible band, the near infrared band or the infrared band or any combination thereof. For clarity, in the subsequent examples, three luminescent materials will be used and they will be referred to as short wavelength, medium wavelength, and long wavelength materials to denote that each material acts on a different, but related, portion of the spectrum. For example, these portions of the spectrum could be blue, green, and red but other portions of the spectrum are equally applicable.

FIGS. 21A and 21B show a multi-layer pulsed stimulated emission luminescent light-guide solar concentrator 2100. Multiple layers of different luminescent material can be combined in a single device as shown. Three solar concentration layers, a short wavelength luminescent layer 2112, a medium wavelength luminescent layer 2114, and a long wavelength luminescent layer 2116 are stacked, with cladding layers 2118 separating them. Each layer is a luminescent solar concentrator, with a pulsed light source 2120, 2122, 2124 and a light collection area where a solar energy collector 2126, 2128, 2130 can be placed. Each of the light sources 2120, 2122, 2124, are adapted to emit the spectrum of light required to stimulate emission in the corresponding luminescent layers 2112, 2114, 2116. The solar energy collectors 2126, 2128, 2130 are selected to efficiently convert the portion of the spectra being emitted in their corresponding layer. The solar energy collectors 2126, 2128, 2130 and the pulsed light sources 2120, 2122, 2124 can be mounted onto substrates 2132 and 2134. The cladding 2118 has a lower index of refraction than the solar concentration layers 2112, 2114, 2116 it separates and prevents the intensified probe light 2136, 2138, and 2140, from leaving one layer and entering another. The cladding 2118 could be made, for example, out of fluorinated ethylene propylene or another low index material. The layers could be made from glass or polymers.

A three-layer, pie-shaped stimulated emission luminescent solar concentrator 2200 is shown in FIGS. 22A-22C. The solar concentrator 2200 has an elliptical peripheral edge 2242 with a reflective surface 2244 for reflecting augmented light 146, such that the reflected light converges towards the a solar energy collector.

The solar concentration layers are a short wavelength luminescent layer 2212, a medium wavelength luminescent layer 2214, and a long wavelength luminescent layer 2216. Three pulsed light sources 2220, 2222, 2224 and three solar energy collectors 2226, 2228, 2230 can either be aligned vertically, as shown in FIG. 22A, so that each is perfectly at the focal point of the ellipse (as shown in FIG. 22A) or they can be misaligned slightly (as shown in FIGS. 22B and 22C). Moving both the light emitting device and solar energy collectors slightly away from the focal points can provide more space for wiring and mounting to circuit board 2246. A single substrate 2246 can be used to mount all the light emitting devices and photovoltaic cells as shown in FIG. 22D.

A solar panel assembly 2300 comprising a plurality of pie-shaped pulsed stimulated emission luminescent light-guide solar concentrators 2301 is shown in FIGS. 23A and 23B. Solar concentrators 2301, are arranged into an array and packed tightly to form a panel.

Figure 24A:
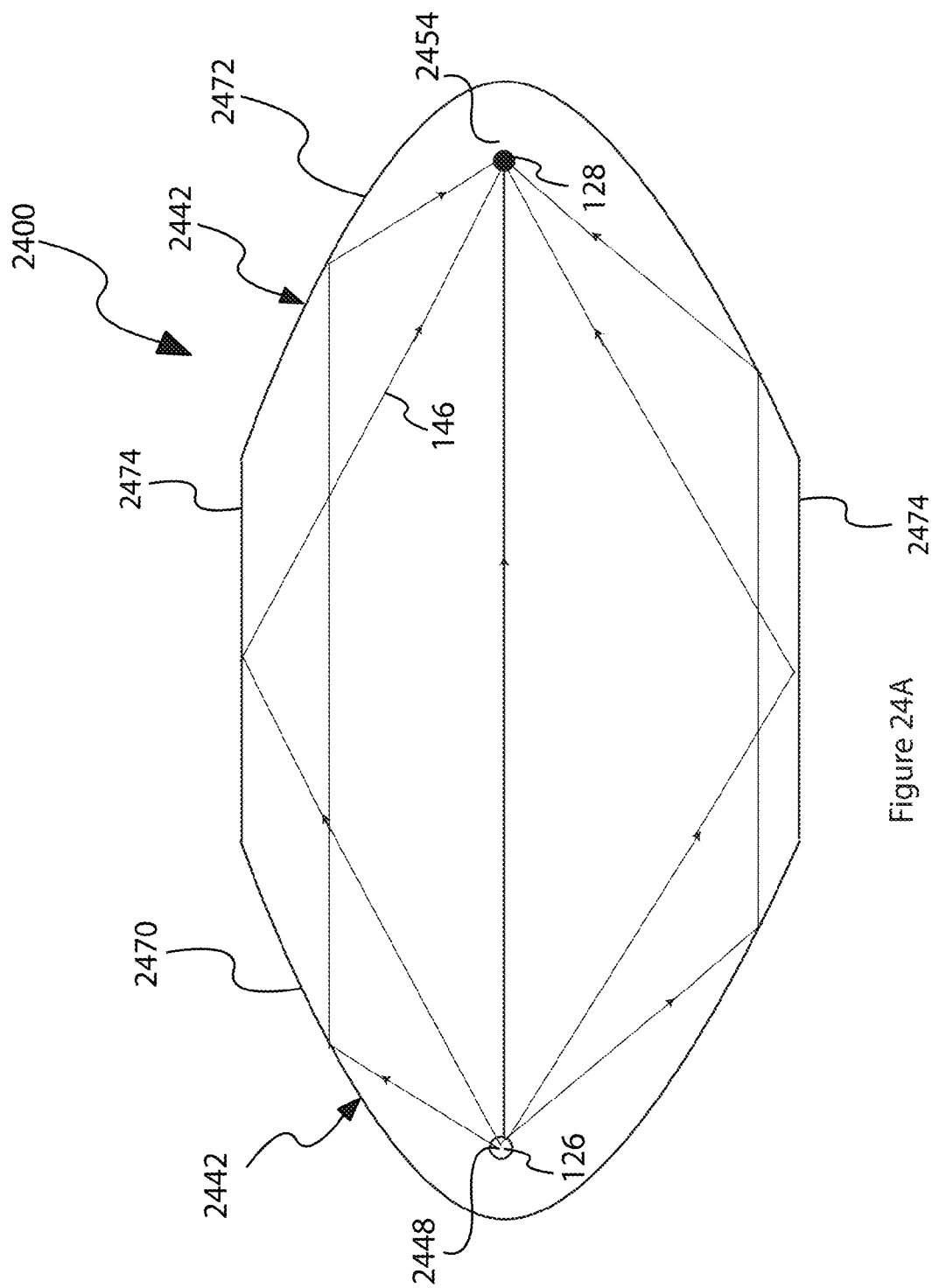
FIG. 24A is a plan view of an embodiment of a pulsed stimulated emission luminescent light guide solar concentrator having two compound parabolic concentrators.

A pulsed stimulated emission luminescent light-guide solar concentrator 2400 similar to that of FIGS. 7A and 7B, but having a compound, planar disk shape is shown in FIG. 24A. The disk shape of the solar concentrator 2400 comprises a first parabolic portion 2470 facing a second parabolic portion 2472. The two parabolic portions 2470, 2472 may be joined by a rectangular portion 2474 as shown in FIG. 24A, but need not have such a rectangular portion. The first parabolic portion 2470 has a first focal point 2448 at which a puled light source 126 is placed. The second parabolic portion 2472 has a second focal point 2454 where a solar energy collector 128 can be placed. The solar concentrator 2400 has a peripheral reflective edge 2442 that can reflect light via TIR without the need for a reflective coating. Probe light 134 spreads out from the first focal point 2448 is augmented by stimulated emission, is reflected via TIR by the peripheral reflective edge and the augmented light 146 converges on the second focal point 2454.

Figure 24B:
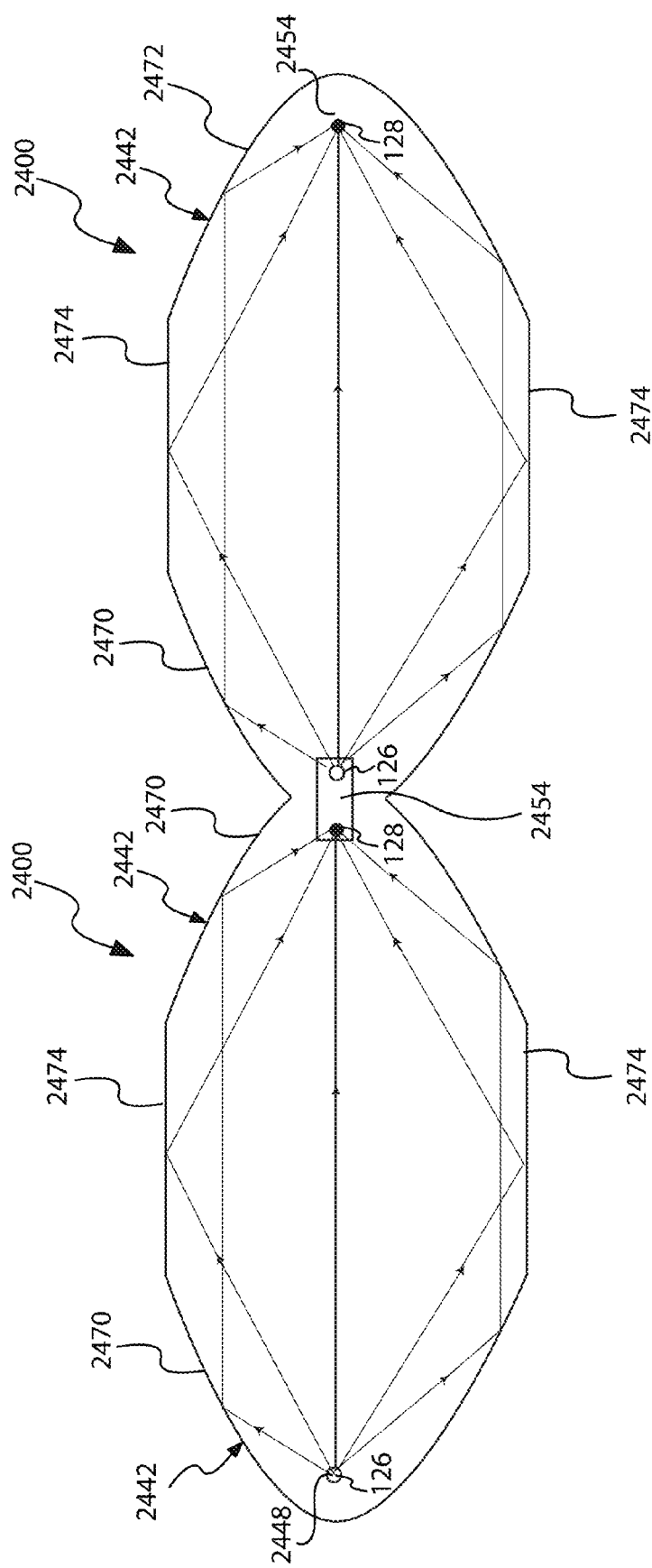
FIG. 24B is a plan view of an array of pulsed stimulated emission luminescent light guide solar concentrators of the type shown in FIG. 24A connected at their distal ends.

An array of solar concentrators 2400, which are connected at their distal ends, is shown in FIG. 24B. A stimulated emission solar concentration assembly comprising such an array of solar concentrators 2400 would facilitate the use of a single circuit board for mounting the light source 126 of one solar concentrator 2400 and the solar energy collector 128 of a neighbouring solar concentrator 2400. Similar embodiments could be made, having a bi-layer or a multi-layer design.

Modifications and improvements to the above-described embodiments of the present invention may become apparent to those skilled in the art. The foregoing description is intended to be exemplary rather than limiting. The scope of the present invention is therefore intended to be limited solely by the scope of the appended claims.

The invention claimed is:

1. A photovoltaic solar concentrator comprising:
   a light-transmissive sheet including:
      a plurality of luminescent particles capable of becoming excited by absorbing light within at least a first spectrum of absorption frequencies and, once excited, capable of being stimulated to emit light having a spectrum within at least a first spectrum of emission frequencies; and
      a first light-guide; and
   at least one light source for generating a pulsed probe light having a spectrum, at least a portion of which is within at least the first spectrum of emission frequencies, for stimulating at least one of the excited luminescent particles having absorbed light within the first spectrum of absorption frequencies such that when the pulsed probe light traveling in a first direction of travel stimulates the excited luminescent particles, the excited luminescent particles emit emitted light having a spectrum within the first spectrum of emission frequencies in the first direction of travel of the pulsed probe light;
   the first light-guide for assisting in guiding the emitted light and the pulsed probe light via total internal reflection, the light-transmissive sheet being shaped such that the emitted light and the pulsed probe light are concentrated to and converge at a focus, a light collection area of the solar concentrator being at the focus; and
   at least one photovoltaic cell disposed at the light collection area of the solar concentrator.

2. The photovoltaic solar concentrator of claim 1, wherein the pulsed probe light is generated by turning each of the at least one light source on and off.

3. The photovoltaic solar concentrator of claim 1, wherein the each of the at least one light source is a constant light source, and the pulsed probe light is generated by shuttering each constant light source.

4. The photovoltaic solar concentrator of claim 1, wherein the light-transmissive sheet is generally of a shape selected from a group consisting of a circular disk, an elliptical disk, a section of an elliptical disk, a plurality of sections of elliptical disks forming a reflecting edge of many reflecting facets, and
   if the shape of the light-transmissive sheet is a circular disk, the circular disk has a focal point, and the at least one light source and the light collection area of the solar concentrator are substantially at the focal point;
   if the shape of the light-transmissive sheet is an elliptical disk, the elliptical disk has two foci, and the at least one light source of the solar concentrator is at one of the foci and the light collection area of the solar concentrator is at the other of the foci;
   if the shape of the light-transmissive sheet is a section of an elliptical disk, the section of the elliptical disk has two foci on an edge thereof, and the at least one light source of the solar concentrator is at one of the foci and the light collection area of the solar concentrator is at the other of the foci; and
   if the shape of the light-transmissive sheet is a plurality of sections of elliptical disks, each of the plurality of sections of elliptical disks has two foci in common with each of the other plurality of sections of elliptical disks, and the at least one light source of the solar concentrator is at one of the common foci and the light collection area of the solar concentrator is at the other of the common foci.

5. The photovoltaic solar concentrator of claim 1, wherein the light-transmissive sheet is disk-shaped and comprises a first parabolic portion facing a second parabolic portion, the first parabolic portion having a first focal point, the second parabolic portion having a second focal point, the at least one light source of the solar concentrator being at the first focal point and the light collection area of the solar concentrator being at the second focal point.

6. The photovoltaic solar concentrator of claim 1, further comprising at least one secondary optic adjacent at least one of the light collection area and the at least one light source.

7. The photovoltaic solar concentrator of claim 6, wherein the at least one secondary optic is made of a different material than adjacent materials.

8. The photovoltaic solar concentrator of claim 1, further comprising a first reflector positioned at an edge of the light-transmissive sheet so as to reflect light toward the light collection area.

9. The photovoltaic solar concentrator of claim 1, further comprising a second light-guide optically coupled to the light-transmissive sheet, the second light-guide for guiding light received from the light-transmissive sheet to the light collection area of the solar concentrator; the light-transmissive sheet and the second light-guide being stacked one upon the other and separated from one another by a first material having a lower index of refraction than that of both the light-transmissive sheet and the second light-guide; and a macroscopic direction of travel of light within the light-transmissive sheet and a macroscopic direction of travel of light within the second light-guide being generally opposite one another.

10. The photovoltaic solar concentrator of claim 1, wherein the light-transmissive sheet comprises a transparent substrate and the luminescent particles are a luminescent dye impregnated in the substrate.

11. The photovoltaic solar concentrator of claim 1, wherein the luminescent particles are within a luminescent layer adjacent to and optically coupled with the first light-guide.

12. The photovoltaic solar concentrator of claim 1, wherein light is reflected from an edge of the light-transmissive sheet via total internal reflection toward the light collection area.

13. The photovoltaic solar concentrator of claim 1, further comprising a fiber optic for collecting light from the light collection area and re-inserting the light into the light-transmissive sheet, such that at least one of the at least one light source is the fiber optic.

14. The photovoltaic solar concentrator of claim 1, wherein the at least one light source and the at least one photovoltaic cell are disposed on a single circuit board.

15. The photovoltaic solar concentrator of claim 1, wherein the at least one light source is powered by energy from the at least one photovoltaic cell.

16. A photovoltaic solar concentrator module comprising:
   at least two solar concentrators of claim 1, each solar concentrator being adjacent to and optically coupled with the other solar concentrators, the luminescent particles of each of the solar concentrators being capable of becoming excited by absorbing light within a spectrum of absorption frequencies that includes, at least in part, different absorption frequencies from the spectrum of absorption frequencies of the other solar concentrators and each of the solar concentrators being capable of being stimulated to emit light of at least one emission frequency within a spectrum of emission frequencies that is, at least in part, different from the spectrum of emission frequencies of the other solar concentrators; and at least one photovoltaic cell disposed at each of the light collection areas of the concentrators.

17. The solar concentrator module of claim 16, wherein at least two light-transmissive sheets of the solar concentrators are separated from one another by a second material having a lower index of refraction than that of the at least two light-transmissive sheets.

18. A photovoltaic solar energy collector assembly comprising a plurality of solar concentrators of claim 1; at least two light sources of the concentrators being in optical communication with a central light source such that the at least two light sources emit pulsed probe light generated by the central light source.

19. A solar concentrator comprising:
   a light-transmissive sheet including:
      a plurality of luminescent particles capable of becoming excited by absorbing light within at least a first spectrum of absorption frequencies and, once excited, capable of being stimulated to emit light having a spectrum within at least a first spectrum of emission frequencies; and
      a first light-guide; and
   at least one light source for generating a pulsed probe light having a spectrum, at least a portion of which is within at least the first spectrum of emission frequencies, for stimulating at least one of the excited luminescent particles having absorbed light within the first spectrum of absorption frequencies such that when the pulsed probe light traveling in a first direction of travel stimulates the excited luminescent particles, the excited luminescent particles emit emitted light having a spectrum within the first spectrum of emission frequencies in the first direction of travel of the pulsed probe light;
   the first light-guide for assisting in guiding the emitted light and the pulsed probe light via total internal reflection, the light-transmissive sheet being shaped such that the emitted light and the pulsed probe light are concentrated to and converge at a focus, a light collection area of the solar concentrator being at the focus; and
   the light-transmissive sheet being generally of a shape selected from a group consisting of a circular disk, an elliptical disk, a section of an elliptical disk, a plurality of sections of elliptical disks forming a reflecting edge of many reflecting facets, and
      if the shape of the light-transmissive sheet is a circular disk, the circular disk has a focal point, and the at least one light source and the light collection area of the solar concentrator are substantially at the focal point;
      if the shape of the light-transmissive sheet is an elliptical disk, the elliptical disk has two foci, and the at least one light source of the solar concentrator is at one of the foci and the light collection area of the solar concentrator is at the other of the foci;
      if the shape of the light-transmissive sheet is a section of an elliptical disk, the section of the elliptical disk has two foci on an edge thereof, and the at least one light source of the solar concentrator is at one of the foci and the light collection area of the solar concentrator is at the other of the foci; and
      if the shape of the light-transmissive sheet is a plurality of sections of elliptical disks, each of the plurality of sections of elliptical disks has two foci in common with each of the other plurality of sections of elliptical disks, and the at least one light source of the solar concentrator is at one of the common foci and the light collection area of the solar concentrator is at the other of the common foci.

* * * * *